(12) United States Patent
Weng et al.

(10) Patent No.: US 12,222,653 B2
(45) Date of Patent: Feb. 11, 2025

(54) METHOD FOR FORMING SEMICONDUCTOR STRUCTURE

(71) Applicant: TAIWAN SEMICONDUCTOR MANUFACTURING COMPANY, LTD., Hsinchu (TW)

(72) Inventors: Ming-Hui Weng, New Taipei (TW); An-Ren Zi, Hsinchu (TW); Ching-Yu Chang, Yuansun village (TW); Chin-Hsiang Lin, Hsin-chu (TW); Chen-Yu Liu, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 856 days.

(21) Appl. No.: 17/320,754

(22) Filed: May 14, 2021

(65) Prior Publication Data
US 2021/0286269 A1     Sep. 16, 2021

Related U.S. Application Data

(60) Division of application No. 16/572,286, filed on Sep. 16, 2019, now Pat. No. 11,009,796, which is a
(Continued)

(51) Int. Cl.
*G03F 7/30* (2006.01)
*G03F 7/32* (2006.01)
(Continued)

(52) U.S. Cl.
CPC .............. *G03F 7/30* (2013.01); *G03F 7/325* (2013.01); *G03F 7/40* (2013.01);
(Continued)

(58) Field of Classification Search
None
See application file for complete search history.

(56) References Cited

U.S. PATENT DOCUMENTS

| | | |
|---|---|---|
| 8,764,995 B2 | 7/2014 | Chang et al. |
| 8,796,666 B1 | 8/2014 | Huang et al. |
| (Continued) | | |

FOREIGN PATENT DOCUMENTS

| | | |
|---|---|---|
| CN | 107111228 A | 8/2017 |
| CN | 109545666 A | 3/2019 |
| (Continued) | | |

*Primary Examiner* — Sean M DeGuire
*Assistant Examiner* — Andrew Preston Traywick
(74) *Attorney, Agent, or Firm* — Birch, Stewart, Kolasch & Birch, LLP

(57) ABSTRACT

A method for forming a semiconductor device structure is provided. The method includes forming a resist layer over a material layer, the resist layer includes an inorganic material. The inorganic material includes a plurality of metallic cores and a plurality of first linkers bonded to the metallic cores. The method includes forming a modified layer over the resist layer, and the modified layer includes an auxiliary. The method includes performing an exposure process on the modified layer and the resist layer, and removing a portion of the modified layer and a first portion of the resist layer by a first developer. The first developer includes a ketone-based solvent having a substituted or unsubstituted $C_6$-$C_7$ cyclic ketone, an ester-based solvent having a formula (b), or a combination thereof.

20 Claims, 20 Drawing Sheets

Related U.S. Application Data continuation-in-part of application No. 16/053,463, filed on Aug. 2, 2018, now Pat. No. 10,990,013.

(60) Provisional application No. 62/825,257, filed on Mar. 28, 2019, provisional application No. 62/576,782, filed on Oct. 25, 2017, provisional application No. 62/562,070, filed on Sep. 22, 2017.

(51) Int. Cl.
  G03F 7/40     (2006.01)
  H01L 21/02    (2006.01)
  H01L 21/033   (2006.01)
  H01L 21/311   (2006.01)
  H01L 21/3115  (2006.01)

(52) U.S. Cl.
  CPC .. *H01L 21/02271* (2013.01); *H01L 21/02282* (2013.01); *H01L 21/0332* (2013.01); *H01L 21/31116* (2013.01); *H01L 21/31155* (2013.01)

(56) References Cited

U.S. PATENT DOCUMENTS

| | | |
|---|---|---|
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 2011/0008968 A1* | 1/2011 | Chang ............... H01L 21/76811 438/703 |
| 2013/0101812 A1* | 4/2013 | Kamimura ........... G03F 7/0382 430/311 |
| 2015/0079393 A1* | 3/2015 | Freedman ............ G03F 7/0042 546/10 |
| 2017/0037178 A1* | 2/2017 | Thackeray ........... G03F 7/0392 |
| 2018/0087010 A1* | 3/2018 | Takahashi ............ G03F 7/322 |
| 2018/0315617 A1 | 11/2018 | Zi et al. |

FOREIGN PATENT DOCUMENTS

| | | |
|---|---|---|
| CN | 109712870 A | 5/2019 |
| TW | 201446749 A | 12/2014 |
| TW | 201831570 A | 9/2018 |
| TW | 201839802 A | 11/2018 |
| WO | WO-2016181753 A1 * | 11/2016 ............. C11D 7/265 |

* cited by examiner

METHOD FOR FORMING SEMICONDUCTOR STRUCTURE

CROSS REFERENCE TO RELATED APPLICATIONS

The present application is a divisional application of U.S. patent application Ser. No. 16/572,286, filed on Sep. 16, 2019, a Continuation-In-Part application of U.S. Ser. No. 16/053,463, filed Aug. 2, 2018, which claims the benefit of U.S. Provisional Application No. 62/562,070, filed on Sep. 22, 2017 and U.S. Provisional Application No. 62/576,782, filed on Oct. 25, 2017, the entirety of which are incorporated by reference herein. This application claims the benefit of U.S. Provisional Application No. 62/825,257, filed on Mar. 28, 2019, the entirety of which are incorporated by reference herein. This application is related to the following commonly assigned patent application: U.S. Ser. No. 16/021,521, filed on 28 Jun. 2018, entitled "Method for forming semiconductor structure", which claims the benefit of U.S. Provisional Application No. 62/576,782, filed on Oct. 25, 2017, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
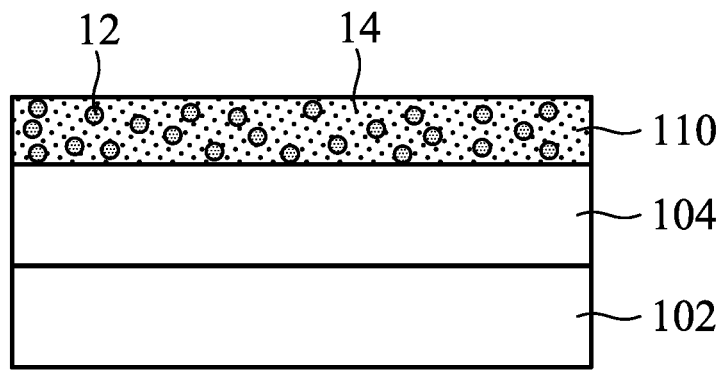
FIGS. 1A-1D show cross-sectional representations of various stages of forming a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Embodiments for a semiconductor structure and method for forming the same are provided. FIGS. 1A-1D show cross-sectional representations of various stages of forming a semiconductor structure, in accordance with some embodiments of the disclosure. The method can be used in many applications, such as fin-type field effect transistor (FinFET) device structure.

Referring to FIG. 1A, a substrate 102 is provided. The substrate 102 may be made of silicon or another semiconductor material. In some embodiments, the substrate 102 is a wafer. Alternatively or additionally, the substrate 102 may include other elementary semiconductor materials such as germanium (Ge). In some embodiments, the substrate 102 is made of a compound semiconductor or alloy semiconductor, such as silicon carbide, gallium arsenic, indium arsenide, or indium phosphide, silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Some device elements may be formed over the substrate 102. The device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes.

The substrate 102 may include various doped regions such as p-type wells or n-type wells). Doped regions may be doped with p-type dopants, such as boron or $BF_2$, and/or n-type dopants, such as phosphorus (P) or arsenic (As). In some other embodiments, the doped regions may be formed directly on the substrate 102.

The substrate 102 also includes isolation structures (not shown). The isolation structure is used to define and electrically isolate various devices formed in and/or over the substrate 102. In some embodiments, the isolation structure includes shallow trench isolation (STI) structure, local oxidation of silicon (LOCOS) structure, or another applicable isolation structure. In some embodiments, the isolation structure includes silicon oxide, silicon nitride, silicon oxynitride, fluoride-doped silicate glass (FSG), or another suitable material.

Afterwards, a material layer 104 is formed over the substrate 102, and a resist layer 110 is formed over the material layer 104, in accordance with some embodiments of the disclosure. In some embodiments, the resist layer 110 includes an inorganic material 12 and an auxiliary 14, and a solvent. The inorganic material 12 and the auxiliary 14 are distributed uniformly in the solvent. The structures of the inorganic material 12 and the auxiliary 14 will be described in detail below. In some embodiments, the material layer 104 or the resist layer 110 is independently formed by a deposition process, such as a spin-on coating process, chemical vapor deposition process (CVD), physical vapor deposition (PVD) process, and/or other suitable deposition processes.

Figure 1B:
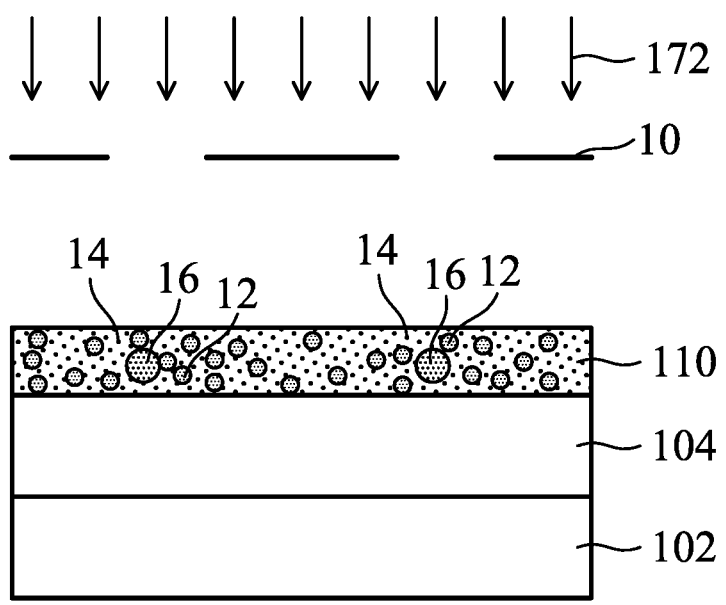

Next, as shown in FIG. 1B, a mask 10 is formed over the resist layer 110, and an exposure process 172 is performed on the resist layer 110 to form an exposed region and an unexposed region, in accordance with some embodiments of the disclosure.

The radiation of the exposure process 172 may include 248 nm beam by Krypton Fluoride (KrF) excimer lasers, a 193 nm beam by Argon Fluoride (ArF) excimer lasers, a 157 nm beam by Fluoride ($F_2$) Excimer Lasers, or Extreme ultra-violet (EUV) light, such as EUV light with wavelength of about 13.5 nm.

After the exposure process 172, a post-exposure-baking (PEB) process is performed. In some embodiments, the PEB process includes using a microwave or an IR lamping heating process. In some embodiments, the PEB process is performed at a temperature in a range from about 70 degrees Celsius to about 250 degrees Celsius. In some embodiments, the PEB process is performed for a period of time in a range from about 20 seconds to about 240 seconds. It should be noted that since the microwave or the IR lamping heating process can provide the heat uniformly, the resist layer 110 is baked at a certain temperature uniformly by using the microwave or the IR lamping heating process. The chemical reaction in the resist layer 110 can react quickly by providing heat uniformly. As a result, the heating time of the baking process may be reduced to less than 30 seconds.

Figure 3A:
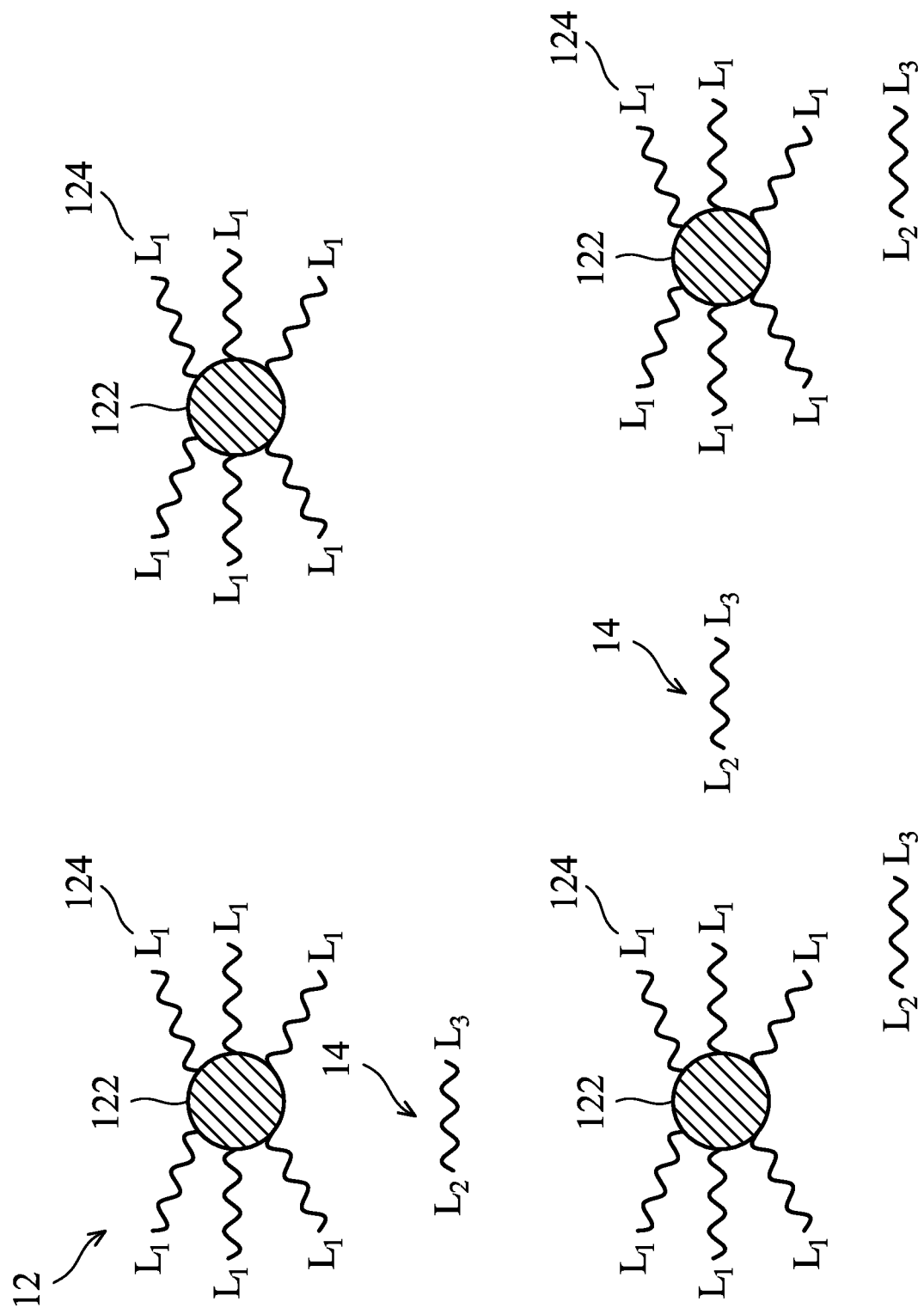
FIG. 3A shows a diagrammatical view of a chemical structure of the resist layer before performing the exposure process, in accordance with some embodiments.

FIG. 3A shows a diagrammatical view of a chemical structure of the resist layer 110 before performing the exposure process 172, in accordance with some embodiments.

In some embodiments, the resist layer 110 includes an inorganic material 12 and an auxiliary 14, and a solvent. The inorganic material 12 and the auxiliary 14 are distributed uniformly in the solvent. The inorganic material 12 includes a number of metallic cores 122 and a number of first linker $L_1$ 124 bonded to the metallic cores 122. In some embodiments, the first linker $L_1$ 124 is chemically bonded to the metallic cores 122. The chemical bonding of the chemical bonds may be a single bonding or a conjugated bonding. The auxiliary 14 may include the photoacid generator (PAG), the quencher (Q), the cross-linker, the photo base generator (PBG), or a combination thereof. In some embodiments, the weight ratio of the auxiliary 14 to the solvent is in a range from about 0.1 wt % to about 10 wt %. If the weight ratio of the auxiliary 14 to the solvent is smaller than 0.1 wt %, the reaction rate of cross-linking reactions between the inorganic material 12 and the auxiliary 14 may not be increased. If the weight ratio of the auxiliary 14 to the solvent is greater than 10 wt %, other unwanted chemical reactions may occur. For example, if the amount of the auxiliary 14 is too much, the melting point of the inorganic material 12 may be decreased. Once the melting point of the inorganic material 12 is decreased, the heat resistance of inorganic material 12 to the baking temperature will be deceased and the performance of the resist layer 110 will be degraded.

In some embodiments, the metallic cores 122 are made of metal, such as tin (Sn), indium (In), antimony (Sb) or another applicable material. In some embodiments, the first linkers 124 include aliphatic or aromatic group, unbranched or branched, cyclic or noncyclic saturated with 1-9 carbon ($C_1$-$C_9$) unit having hydrogen or oxygen or halogen (such as, alky, alkene, benzene). The first linkers 124 are used to provide the radiation sensitivity in some embodiments. In some embodiments, the first linkers 124 have a hydroxyl group (—OH), the second linkers $L_2$ have a hydroxyl group (—OH), and the two hydroxyl groups react with each other to perform a hydrolysis reaction. In some other embodiments, the first linkers $L_1$ 124 have a carbon-carbon double bond (alkenes), or the carbon-carbon triple bonds (alkynes), and the second linkers $L_2$ react with the first linkers $L_1$ 124 to perform an addition reaction. In some other embodiments, the first linkers $L_1$ 124 have carbonyl (C=O) groups or imine (C=N) groups, and the second linkers $L_2$ react with the first linkers $L_1$ 124 to perform an addition reaction.

In some embodiments, the auxiliary 14 include the second linkers $L_2$ and the third linkers $L_3$ which can react with the first linkers 124 on the metallic cores 122. With the help of the auxiliary 14, one of the metallic cores 122 bonds to another metallic core 122 to form a compound 16 which has a size greater than the size of each of the metallic cores 122.

In certain embodiments, the solvent includes propylene glycol methyl ether acetate (PGMEA), propylene glycol monomethyl ether (PGME), 1-ethoxy-2-propanol (PGEE), gamma-butyrolactone (GBL), cyclohexanone (CHN), ethyl lactate (EL), methanol, ethanol, propanol, n-butanol, acetone, dimethylformamide (DMF), isopropyl alcohol (IPA), tetrahydrofuran (THF), methyl isobutyl carbinol (MIBC), n-butyl acetate (nBA), 2-heptanone (MAK), or a combination thereof.

In some embodiments, the photoacid generator (PAG) includes a cation and an anion. In some embodiments, the cation includes formulas (I) or (II). In some embodiments, the anion includes formulas (III), (IV), (V), (VI), (VII), (VIII), (IX), (X), (XI) or (XII).

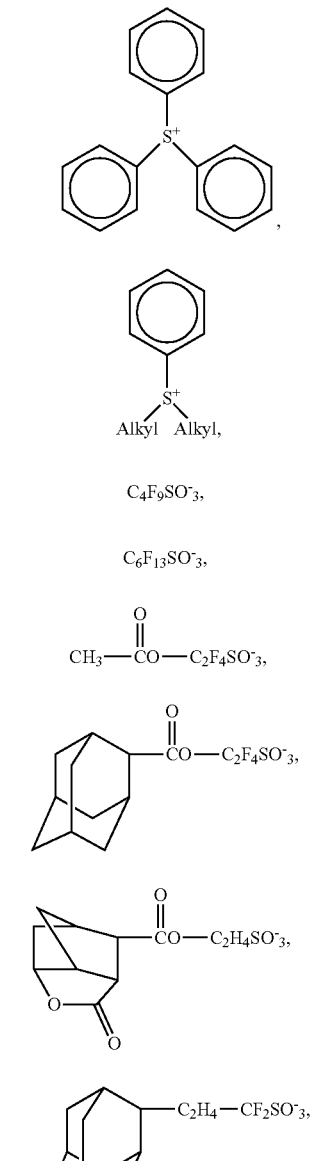

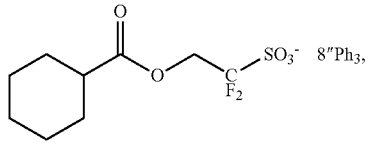

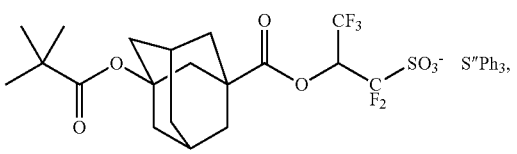

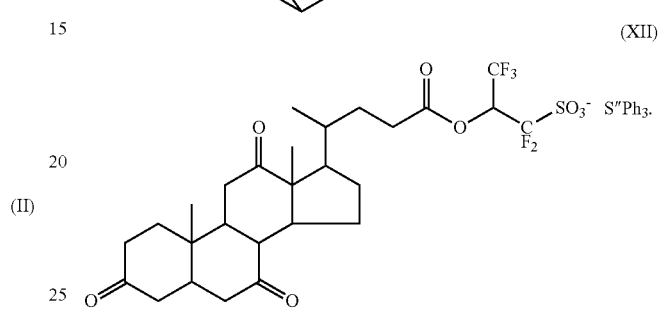

In some embodiments, the quencher (Q) includes formulas (XIII), (XIV), (XV), (XVI), (XVII), (XVIII), (XIX), (XX) or (XXI).

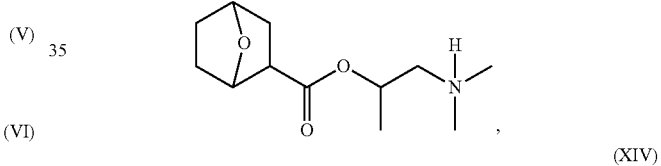

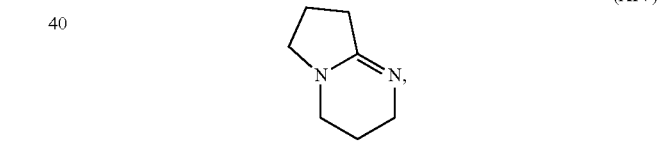

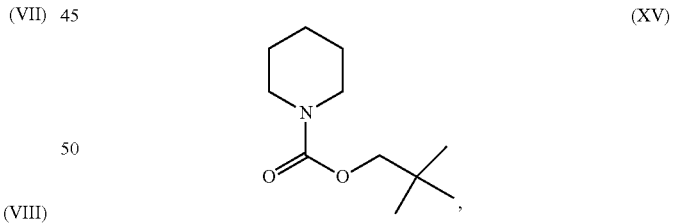

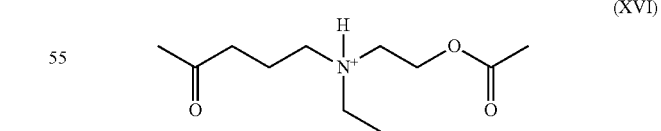

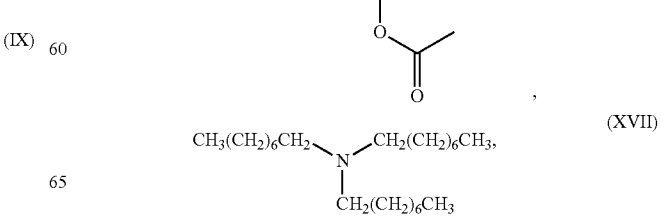

-continued (XVIII)

(XIX)

(XX)

(XXI)

In some embodiments, the cross-linker includes formulas (XXII), (XXIII), (XXIV), (XXV), (XXVI), (XXVII), (XXVIII), (XXIX), or (XXX).

(XXII)

(XXIII)

(XXIV)

(XXV)

(XXVI)

(XXVII)

(XXVIII)

(XXIX)

(XXX)

In some embodiments, the photo base generator (PBG) includes formulas (XXXI), (XXXII), (XXXIII), (XXXIV), (XXXV), (XXXVI), (XXXVII), (XXXVIII), or (XXXIX), (XL), (XLI) or (XLII).

(XXXI)

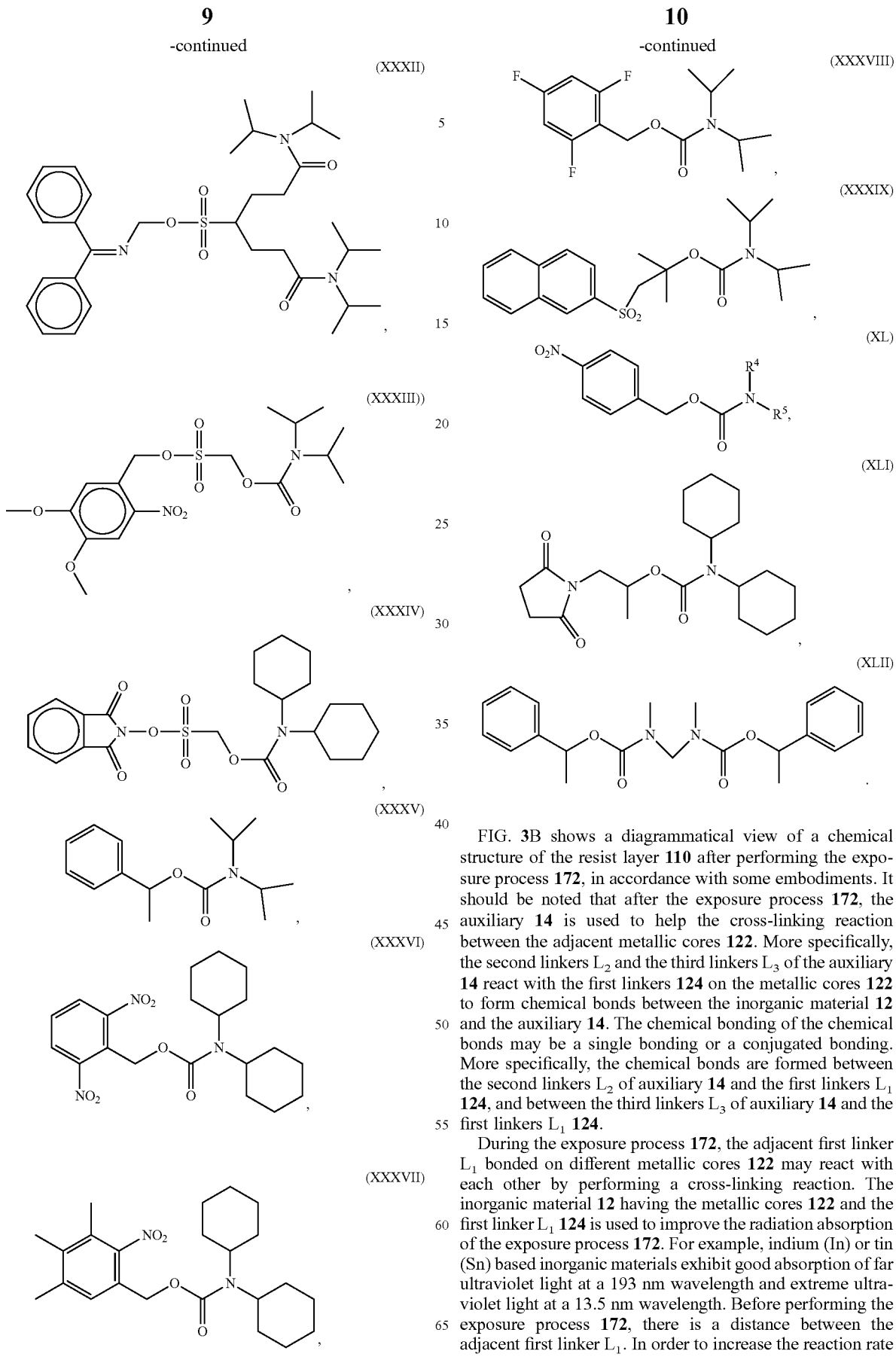

Figure 3B:
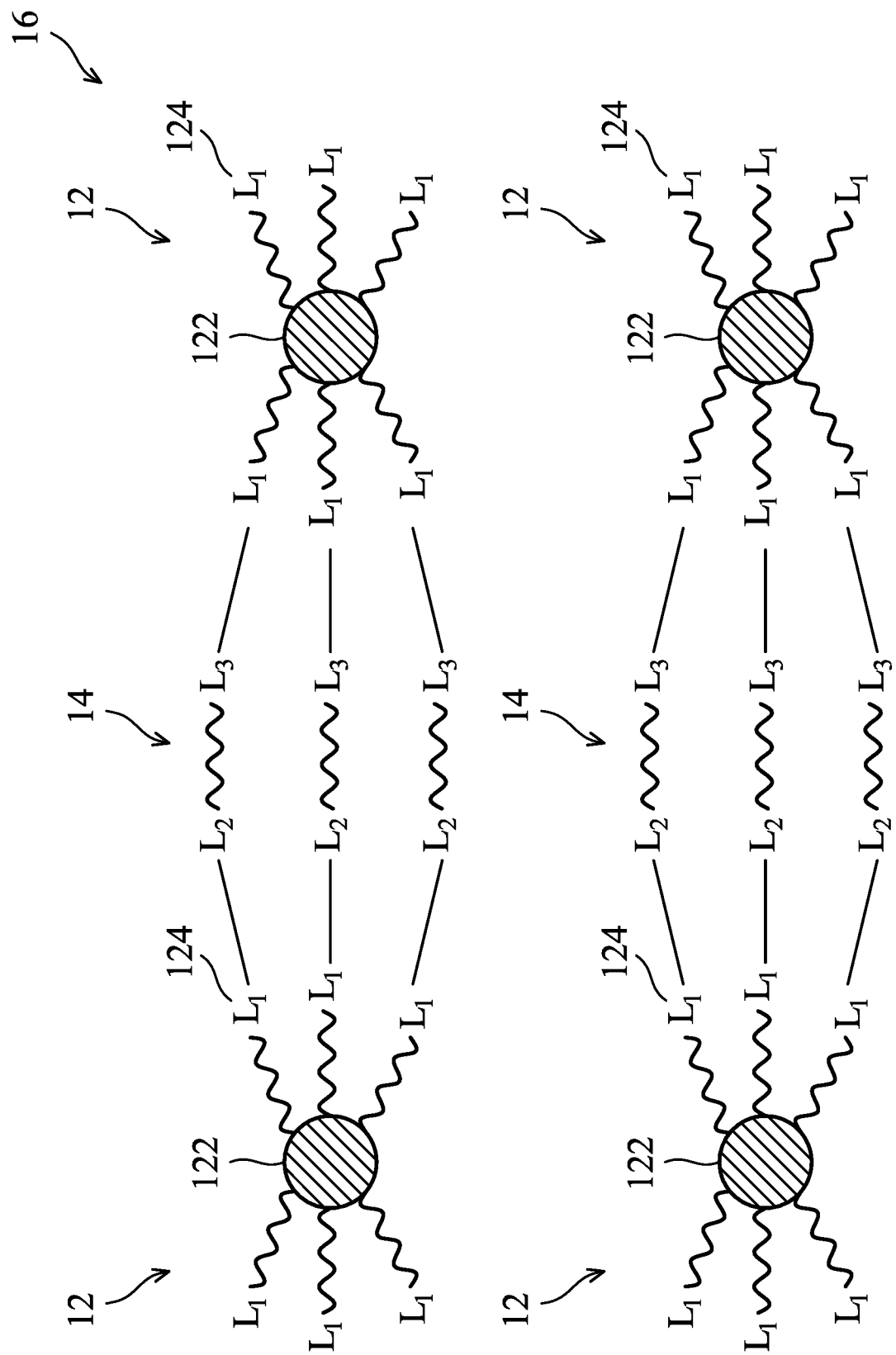
FIG. 3B shows a diagrammatical view of a chemical structure of the resist layer after performing the exposure process, in accordance with some embodiments.

FIG. 3B shows a diagrammatical view of a chemical structure of the resist layer 110 after performing the exposure process 172, in accordance with some embodiments. It should be noted that after the exposure process 172, the auxiliary 14 is used to help the cross-linking reaction between the adjacent metallic cores 122. More specifically, the second linkers $L_2$ and the third linkers $L_3$ of the auxiliary 14 react with the first linkers 124 on the metallic cores 122 to form chemical bonds between the inorganic material 12 and the auxiliary 14. The chemical bonding of the chemical bonds may be a single bonding or a conjugated bonding. More specifically, the chemical bonds are formed between the second linkers $L_2$ of auxiliary 14 and the first linkers $L_1$ 124, and between the third linkers $L_3$ of auxiliary 14 and the first linkers $L_1$ 124.

During the exposure process 172, the adjacent first linker $L_1$ bonded on different metallic cores 122 may react with each other by performing a cross-linking reaction. The inorganic material 12 having the metallic cores 122 and the first linker $L_1$ 124 is used to improve the radiation absorption of the exposure process 172. For example, indium (In) or tin (Sn) based inorganic materials exhibit good absorption of far ultraviolet light at a 193 nm wavelength and extreme ultraviolet light at a 13.5 nm wavelength. Before performing the exposure process 172, there is a distance between the adjacent first linker $L_1$. In order to increase the reaction rate of the cross-linking reaction, the auxiliary 14 is added into the resist layer 110. The auxiliary 14 can shorten the distance between adjacent metallic cores 122, and therefore one of first linkers $L_1$ 124 on the first the metallic core 122 can react with one of the first linkers $L_1$ 124 on the second metallic core 122 with the help of the second linkers $L_2$ and the third linkers $L_3$ of the auxiliary 14. It should be noted that the cross-linking reaction between the adjacent metallic cores 122 is improved by the addition of the auxiliary 14.

In a comparative embodiment, the resist layer 110 includes the inorganic material 12 and the solvent, but does not include the auxiliary 14 described above. The cross-linking reaction between the adjacent metallic cores 122 in the comparative embodiment has a first reaction rate. In some embodiments, the resist layer 110 includes the inorganic material 12 and the auxiliary 14 described above, and the solvent described above. The cross-linking reaction between the adjacent metallic cores 122 has a second reaction rate. One of the metallic cores 122 is bonded to another metallic core 122 by the addition of the auxiliary 14. The reaction rate of the cross-linking reaction between the adjacent metallic cores 122 is increased by the help of the auxiliary 14. The second reaction rate is greater than the first reaction rate due to the help of the auxiliary 14.

Figure 1C:
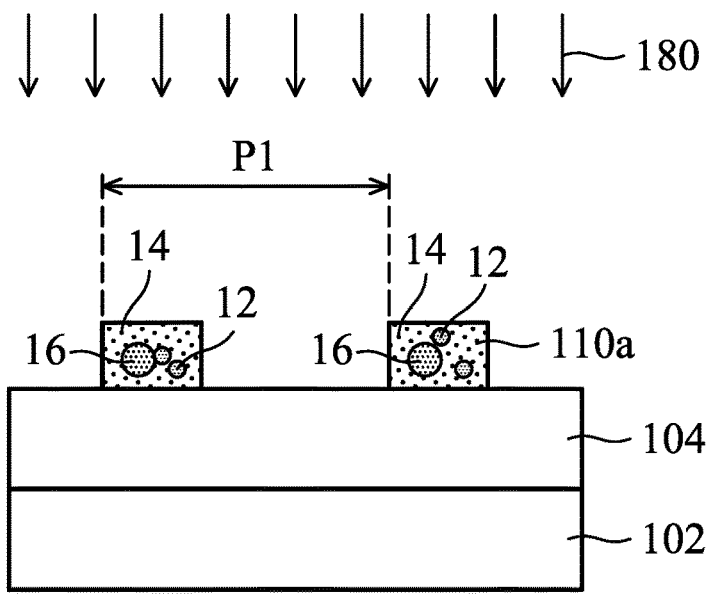

Next, as shown in FIG. 1C, the resist layer 110 is developed by performing a development process 180 to form a patterned resist layer 110a, in accordance with some embodiments of the disclosure. The compound 16 is formed in the resist layer 110. The compound 16 is formed by reacting the inorganic material 12 and the auxiliary 14. A portion of the metallic cores 122 is reacted with the auxiliary 14, but another portion of the metallic cores 122 is remaining in the resist layer 110. In other words, the compound 16 is formed by the inorganic material 12 and the auxiliary 14 through the first linkers L1, the second linkers $L_2$ and the third linkers $L_3$.

There are two types of developing processes: a positive tone development (PTD) process and a negative tone development (NTD) process. The PTD process uses a positive tone developer, which generally refers to a developer that selectively dissolves and removes exposed portions of the resist layer. The NTD process uses a negative tone developer, which generally refers to a developer that selectively dissolves and removes unexposed portions of the resist layer 110. In some embodiments, the PTD developers are aqueous base developers, such as tetraalkylammonium hydroxide (TMAH).

The development process 180 is performed by using a developer. The developer has a high hydrophobic and a lower dipole momentum. In some embodiments, the dipole momentum of the developer used in the development process 180 is in a range from about 0.8 debye to about 4 debye. If the dipole momentum is smaller than 0.8 debye, the solubility of the non-exposed portions of the resist layer 110 may be too low, and unwanted resist residue in the non-exposed portions may not be removed completely (the non-exposed portions should be completely removed). If the dipole momentum is greater than 4 debye, the solubility of the exposed portions of the resist layer 110 may be too high, and the exposed portions of the resist layer 110 may be over-developed (the exposed portions should be maintained) and the shape of the exposed portions is broken or necking.

In some embodiments, the NTD developer includes a ketone-based solvent, an ester-based solvent or a combination thereof. In some embodiments, the NTD developer includes a ketone-based solvent having a total number of carbon atoms in a range from 5 to 15. In some embodiments, the ketone-based solvent has a formula (a):

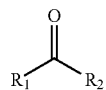

(a)

wherein $R_1$ is linear or branched $C_1$-$C_5$ alkyl, and $R_2$ is linear or branched $C_3$-$C_9$ alkyl.

In some embodiments, the ketone-based solvent does not include 2-heptanone. In some embodiments, the ketone-based solvent is not 2-heptanone.

Tables 1-9 show some embodiments of the ketone-based developer, in accordance with some embodiments of the disclosure. As shown in Table 1, the ketone-based solvent has the formula (a), wherein $R_1$ is $CH_3$, and $R_2$ is linear or branched $C_4$-$C_9$ alkyl. In some embodiments, the ketone-based solvent has the formula (a), wherein $R_1$ is $CH_3$, and $R_2$ is branched $C_5$ alkyl. For example, the ketone-based solvent is 5-Methyl-2-hexanone. In some embodiments, the ketone-based solvent has the formula (a), wherein $R_1$ is $CH_3$, and $R_2$ is linear $C_6$ alkyl. For example, the ketone-based solvent is 2-octanone.

TABLE 1

| Example | Structural formula | Chemical name |
|---|---|---|
| 1 | | 2-hexanone |
| 2 | | 5-Methyl-2-hexanone |
| 3 | | 4-Methyl-2-hexanone |
| 4 | | 3-Methyl-2-hexanone |
| 5 | | 5-ethyl-2-hexanone |
| 6 | | 4-ethyl-2-hexanone |
| 7 | | 3-ethyl-2-hexanone |
| 8 | | 6-Methyl-2-heptanone |

TABLE 1-continued

| Example | Structural formula | Chemical name |
|---|---|---|
| 9 | | 5-Methyl-2-heptanone |
| 10 | | 4-Methyl-2-heptanone |
| 11 | | 3-Methyl-2-heptanone |
| 12 | | 6-ethyl-2-heptanone |
| 13 | | 5-ethyl-2-heptanone |
| 14 | | 4-ethyl-2-heptanone |
| 15 | | 3-ethyl-2-heptanone |
| 16 | | 2-octanone |
| 17 | | 7-methyl-2-octanone |
| 18 | | 6-methyl-2-octanone |
| 19 | | 5-methyl-2-octanone |
| 20 | | 4-methyl-2-octanone |
| 21 | | 3-methyl-2-octanone |
| 22 | | 7-ethyl-2-octanone |
| 23 | | 6-ethyl-2-octanone |
| 24 | | 5-ethyl-2-octanone |
| 25 | | 4-ethyl-2-octanone |
| 26 | | 3-ethyl-2-octanone |
| 27 | | 2-nonanone |
| 28 | | 8-methyl-2-nonanone |
| 29 | | 7-methyl-2-nonanone |
| 30 | | 6-methyl-2-nonanone |
| 31 | | 5-methyl-2-nonanone |

TABLE 1-continued

| Example | Structural formula | Chemical name |
|---|---|---|
| 32 | | 4-methyl-2-nonanone |
| 33 | | 3-methyl-2-nonanone |
| 34 | | 8-ethyl-2-nonanone |
| 35 | | 7-ethyl-2-nonanone |
| 36 | | 6-ethyl-2-nonanone |
| 37 | | 5-ethyl-2-nonanone |
| 38 | | 4-ethyl-2-nonanone |
| 39 | | 3-ethyl-2-nonanone |

As shown in Table 2, the ketone-based solvent has the formula (a), wherein $R_1$ is $C_2H_5$, and $R_2$ is linear or branched $C_4$-$C_8$ alkyl. In some embodiments, the ketone-based solvent has the formula (a), wherein $R_1$ is $C_2H_5$, and $R_2$ is linear $C_4$ alkyl. For example, the ketone-based solvent is 3-heptanone.

TABLE 2

| Example | Structural formula | Chemical name |
|---|---|---|
| 40 | | 3-heptanone |
| 41 | | 6-methyl-3-heptanone |

TABLE 2-continued

| Example | Structural formula | Chemical name |
|---|---|---|
| 42 | | 5-methyl-3-heptanone |
| 43 | | 4-methyl-3-heptanone |
| 44 | | 6-ethyl-3-heptanone |
| 45 | | 5-ethyl-3-heptanone |
| 46 | | 4-ethyl-3-heptanone |
| 47 | | 3-octanone |
| 48 | | 7-methyl-3-octanone |
| 49 | | 6-methyl-3-octanone |
| 50 | | 5-methyl-3-octanone |
| 51 | | 4-methyl-3-octanone |
| 52 | | 7-ethyl-3-octanone |
| 53 | | 6-ethyl-3-octanone |

TABLE 2-continued

| Example | Structural formula | Chemical name |
|---|---|---|
| 54 | | 5-ethyl-3-octanone |
| 55 | | 4-ethyl-3-octanone |
| 56 | | 3-nonanone |
| 57 | | 8-methyl-3-nonanone |
| 58 | | 7-methyl-3-nonanone |
| 59 | | 6-methyl-3-nonanone |
| 60 | | 5-methyl-3-nonanone |
| 61 | | 4-methyl-3-nonanone |
| 62 | | 8-ethyl-3-nonanone |
| 63 | | 7-ethyl-3-nonanone |
| 64 | | 6-ethyl-3-nonanone |
| 65 | | 5-ethyl-3-nonanone |

TABLE 2-continued

| Example | Structural formula | Chemical name |
|---|---|---|
| 66 | | 4-ethyl-3-nonanone |

As shown in Table 3, the ketone-based solvent has the formula (a), wherein $R_1$ is linear $C_3H_7$, and $R_2$ is linear or branched $C_3$-$C_7$ alkyl.

TABLE 3

| Example | Structural formula | Chemical name |
|---|---|---|
| 67 | | 4-heptanone |
| 68 | | 3-methyl-4-heptanone |
| 69 | | 2-methyl-4-heptanone |
| 70 | | 3-ethyl-4-heptanone |
| 71 | | 2-ethyl-4-heptanone |
| 72 | | 4-octanone |
| 73 | | 7-methyl-4-octanone |
| 74 | | 6-methyl-4-octanone |
| 75 | | 5-methyl-4-octanone |

TABLE 3-continued

| Example | Structural formula | Chemical name |
|---|---|---|
| 76 | | 7-ethyl-4-octanone |
| 77 | | 6-ethyl-4-octanone |
| 78 | | 5-ethyl-4-octanone |
| 79 | | 4-nonanone |
| 80 | | 8-methyl-4-nonanone |
| 81 | | 7-methyl-4-nonanone |
| 82 | | 6-methyl-4-nonanone |
| 83 | | 5-methyl-4-nonanone |
| 84 | | 8-ethyl-4-nonanone |
| 85 | | 7-ethyl-4-nonanone |
| 86 | | 6-ethyl-4-nonanone |
| 87 | | 5-ethyl-4-nonanone |

As shown in Table 4, the ketone-based solvent has the formula (a), wherein $R_1$ is branched $C_3H_7$, and $R_2$ is linear $C_4$-$C_6$ alkyl.

TABLE 4

| Example | Structural formula | Chemical name |
|---|---|---|
| 88 | | 2-methyl-3-heptanone |
| 89 | | 2-methyl-3-octanone |
| 90 | | 2-methyl-3-nonanone |

As shown in Table 5, the ketone-based solvent has the formula (a), wherein $R_1$ is branched $C_4H_9$, and $R_2$ is branched $C_4$-$C_6$ alkyl.

TABLE 5

| Example | Structural formula | Chemical name |
|---|---|---|
| 91 | | 2-ethyl-3-heptanone |
| 92 | | 2-ethyl-3-octanone |
| 93 | | 2-ethyl-3-nonanone |
| 94 | | 3-methyl-4-octanone |
| 95 | | 2-methyl-4-octanone |
| 96 | | 2-methyl-4-nonanone |

As shown in Table 6, the ketone-based solvent has the formula (a), wherein $R_1$ is branched $C_5H_{11}$, and $1R_2$ is linear $C_4$-$C_5$ alkyl.

TABLE 6

| | | |
|---|---|---|
| 97 | [structure] | 3-ethyl-4-octanone |
| 98 | [structure] | 2-ethyl-4-octanone |
| 99 | [structure] | 2-ethyl-4-nonanone |

As shown in Table 7, in some embodiments, the ketone-based solvent has the formula (a), wherein $R_1$ is branched $C_3H_7$, and $R_2$ is $C_3H_7$.

TABLE 7

| Example | Structural formula | Chemical name |
|---|---|---|
| 100 | [structure] | 2-Methyl-3-hexanone |

As shown in Table 8, in some embodiments, the ketone-based solvent has the formula (a), wherein $R_1$ is $CH_3$ or $C_3H_7$, $R_2$ is linear or branched $C_3$-$C_5$ alkyl.

TABLE 8

| Example | Structural formula | Chemical name |
|---|---|---|
| 101 | [structure] | 2,4-Dimethyl-3-pentanone |
| 102 | [structure] | 4,4-Dimethyl-2-pentanone |
| 103 | [structure] | 3,4-Dimethyl-2-pentanone |
| 104 | [structure] | 3,3-Dimethyl-2-pentanone |

In some embodiments, the ketone-based solvent is a substituted or unsubstituted $C_6$-$C_7$ cyclic ketone, wherein the substituent group is hydrogen, alkyl. More specifically, as shown in Table 9, in some embodiments, the cyclic ketone has at least one hydrogen atom is substituted with $C_1$-$C_3$ alkyl, such as methyl (—$CH_3$), ethyl (—$C_2H_5$), isopropyl (—$C_3H_7$) or n-propyl (—$C_3H_7$).

TABLE 9

| Example | Structural formula | Chemical name |
|---|---|---|
| 105 | [structure] | 2-Methylcyclohexanone |
| 106 | [structure] | 3-Methylcyclohexanone |
| 107 | [structure] | 4-Methylcyclohexanone |
| 108 | [structure] | Cycloheptanone |

In some embodiments, the developer includes an ester-based solvent having a total number of carbon atoms in a range from about 5 to about 14. In some embodiments, the ester-based solvent has a formula (b):

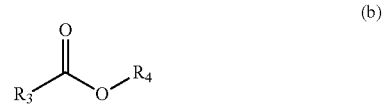

(b)

wherein $R_3$ is linear or branched $C_1$-$C_5$ alkyl, or linear or branched $C_2$ alkoxy, and $R_4$ is linear or branched $C_2$-$C_6$ alkyl, or linear or branched $C_3$-$C_6$ alkoxy.

Tables 10-15 show some embodiments of the ester-based solvent, in accordance with some embodiments of the disclosure. As shown in Table 10, in some embodiments, the ester-based solvent has the formula (b), wherein $R_3$ is $CH_3$, and $R_4$ is linear or branched $C_2$-$C_6$ alkyl, or linear or branched $C_2$-$C_6$ alkoxy.

TABLE 10

| Example | Structural formula | Chemical name |
|---|---|---|
| 109 | [structure] | Butyl acetate |
| 110 | [structure] | Isoamyl acetate |

TABLE 10-continued

| Example | Structural formula | Chemical name |
|---|---|---|
| 111 | | 2-Pentyl acetate |
| 112 | | Amyl acetate |
| 113 | | 2-Methylbutyl acetate |
| 114 | | 1-methoxy-2-propanol acetate |
| 115 | | 1-ethoxy-2-propanol acetate |
| 116 | | 2-Ethoxyethyl acetate |
| 117 | | 2-Methoxyethyl acetate |
| 118 | | 2-Butoxyethyl acetate |
| 119 | | 2-Hydroxyethyl acetate |

As shown in Table 11, in some embodiments, the ester-based solvent has the formula (b), wherein $R_3$ is $C_2H_5$, and $R_4$ is linear or branched $C_4$ alkyl.

| Example | Structural formula | Chemical name |
|---|---|---|
| 120 | | Butyl propionate |
| 121 | | Isobutyl propionate |

As shown in Table 12, in some embodiments, the ester-based solvent has the formula (b), wherein $R_3$ is $C_3H_7$, and $R_4$ is linear or branched $C_3$-$C_4$ alkyl.

TABLE 12

| Example | Structural formula | Chemical name |
|---|---|---|
| 122 | | Butyl butyrate |
| 123 | | Isopropyl butyrate |
| 124 | | Propyl isobutyrate |

As shown in Table 13, in some embodiments, the ester-based solvent has the formula (b), wherein $R_3$ is $C_4H_9$, and $R_4$ is linear or branched $C_2$-$C_4$ alkyl.

TABLE 13

| Example | Structural formula | Chemical name |
|---|---|---|
| 125 | | Butyl 2-methylbutyrate |
| 126 | | Ethyl trimethylacetate |
| 127 | | Ethyl valerate |
| 128 | | Ethyl isovalerate |
| 129 | | Ethyl 2-methylbutyrate |

As shown in Table 14, in some embodiments, the ester-based solvent has the formula (b), wherein $R_3$ is $C_5H_{10}$, and $R_4$ is linear $C_2$ alkyl.

TABLE 14

| Example | Structural formula | Chemical name |
| --- | --- | --- |
| 130 | H3C-CH(CH3)-CH2-C(=O)-O-CH3 (structure) | Methyl 4-methylvalerate |

As shown in Table 15, in some embodiments, the ester-based solvent has the formula (b), wherein $R_3$ is $C_2H_5O$, and $R_4$ is linear or branched $C_2$-$C_3$ alkyl.

TABLE 15

| Example | Structural formula | Chemical name |
| --- | --- | --- |
| 131 | H3CO-CH2-C(=O)-O-CH2-CH3 (structure) | Ethyl methoxyacetate |
| 132 | H3C-CH2-O-C(=O)-CH(OH)-CH3 (structure) | Propyl 2-hydroxypropanoate |

As shown in FIG. 1C, in some embodiments, the negative tone developer (NTD) process is performed, the exposed region of the resist layer 110 remains, and the unexposed region of the resist layer 110 is removed by the ketone-based solvent. The exposed region of the resist layer 110 becomes more hydrophilic after performing the exposure process 172, and therefore the ketone-based solvent is used to remove the unexposed region of the resist layer 110. Furthermore, since the compound 16 has a greater average molecular weight than inorganic material, the compound 16 is not easily dissolved in the organic solvent. Therefore, the exposed region of the resist layer 110 remains while the unexposed region of the resist layer 110 is removed.

The critical dimension (CD) of the patterned resist layer 110a is determined by the radiation energy of the exposure process and the developer of the development (NTD) process. The radiation dose is used to induce the cross-linker reactions between the inorganic material 12 and the auxiliary 14. The high radiation dose will result in a high degree of cross-linking reaction. Therefore, the radiation dose should be increased to obtain a larger CD of the patterned resist layer 110a. However, a higher radiation dose may incur a higher cost. In order to reduce the cost of the exposure process, the unexposed region of the resist layer 110 of this disclosure is removed by using more hydrophobic ketone-based solvent. The compound 16 in the exposed region 110a becomes hydrophilic and is not easily removed by the hydrophobic ketone-based solvent. Therefore, the critical dimension (CD) of exposed region of the resist layer 110a may be increased by using the hydrophobic ketone-based solvent.

In a comparative embodiment, the ketone solvent is 2-heptanone. The ketone-based solvent described in Tables 1-9 of the disclosure or the ester-based solvent described in Tables 10-15 is more hydrophobic than 2-heptanone of the comparative embodiment. Therefore, the exposed region of the resist layer 110 is not removed by using the hydrophobic ketone-based solvent. The disclosure provides a simple method to obtain the greater CD of the patterned resist layer 110a without increasing the radiation dose of the exposure process. In some embodiments, the radiation dose is reduced about 5% to about 10%.

In some embodiments, the developer further includes water ($H_2O$), and a ratio of water to the developer is in a range from about 0.01 wt % to about 3 wt %. The water is used as a catalyst during the cross-linking reactions between the inorganic material 12 and the auxiliary 14. If the cross-linking reactions have not completely performed during the exposure process, the water added in the developer in the development process may help the cross-linking reactions. It should be noted that the amount of the water is not too much, and therefore the polarity of the developer is not apparently affected by water.

In some other embodiments, the developer further includes a surfactant. The surfactant is used to increase the solubility and reduce the surface tension on the material layer 104. In some embodiments, a ratio of the surfactant to the developer is in a range from about 0.01 wt % to about 1 wt %. In some embodiments, the surfactant includes the following formulas (b), (c), (d), (e), (f), or (g), and n represents an integer. In formulas (b), (c), (d) and (e), R is hydrogen or linear $C_1$-$C_{20}$ alkyl. In formulas (f) and (g), $R_1$ is hydrogen or linear $C_1$-$C_{20}$ alkyl, and $R_2$ is hydrogen or linear $C_1$-$C_{20}$ alkyl, PO represents -$CH_2$—$CH_2$—O—, and EO represents —$CH_3$—CH—$CH_2$—O—.

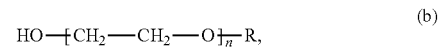
(b)

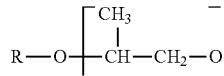
(c)

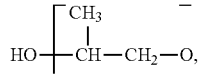
(d)

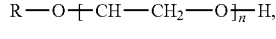
(e)

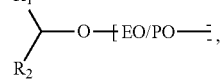
(f)

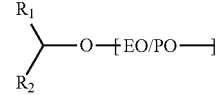
(g)

In some embodiments, the step of removing the unexposed region of the resist layer by using the ketone-based developer is operated at a temperature in a range from about 10 degrees Celsius to about 80 degrees Celsius. The advantage of the temperature of the developer being in above-mentioned range is to reduce the solubility of the resist layer, and therefore more exposed region of the resist layer will be remaining.

The exposed region of the resist layer 110 has a number of protruding structures. In some embodiments, there is a first pitch $P_1$ which is a distance between the right sidewall surface of the first protruding structure and the right sidewall surface of the second protruding structure. In some embodiments, the first pitch $P_1$ is in a range from about 10 nm to about 40 nm.

Figure 1D:
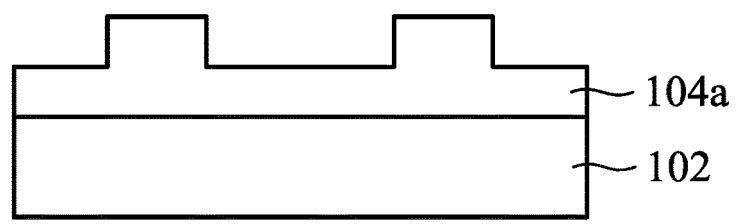

Afterwards, as shown in FIG. 1D, a portion of the material layer 104 is removed by performing an etching process and using the patterned resist layer 110a as a mask. As a result, the patterned material layer 104a is obtained.

The etching process includes a number of etching operations. The etching process may be a dry etching process or a wet etching process. Afterwards, the patterned resist layer 110a is removed. In some embodiments, the patterned resist layer 110a is removed by the wet etching process including a base solution, and the base solution is tetraalkylammonium hydroxide (TMAH). In some other embodiments, the patterned resist layer 110a is removed by the wet etching process including HF solution.

The auxiliary 14 in the resist layer 110 is used to improve the absorption energy of the resist layer 110 during the exposure process 172. With the help of the auxiliary 14, the radiation energy of the exposure process 172 can be reduced to about 3 mJ to about 20 mJ. Furthermore, the line width roughness (LWR) of the resist layer 110 is improved about 3% to about 40%. In addition, the critical dimension uniformity (CDU) is also improved about 3% to about 40%. Therefore, the lithography resolution is improved.

Furthermore, the unexposed region of the resist layer 110 is removed, but the exposed region of the resist layer 110 is not removed by using the hydrophobic ketone-based solvent. The dose of the EUV radiation can be reduced due to use of the ketone-based solvent. As a result, a greater CD of the patterned resist layer 110a is obtained without increasing the radiation dose of the exposure process. Therefore, the throughput of the forming the semiconductor device structure is improved.

Figure 2A:
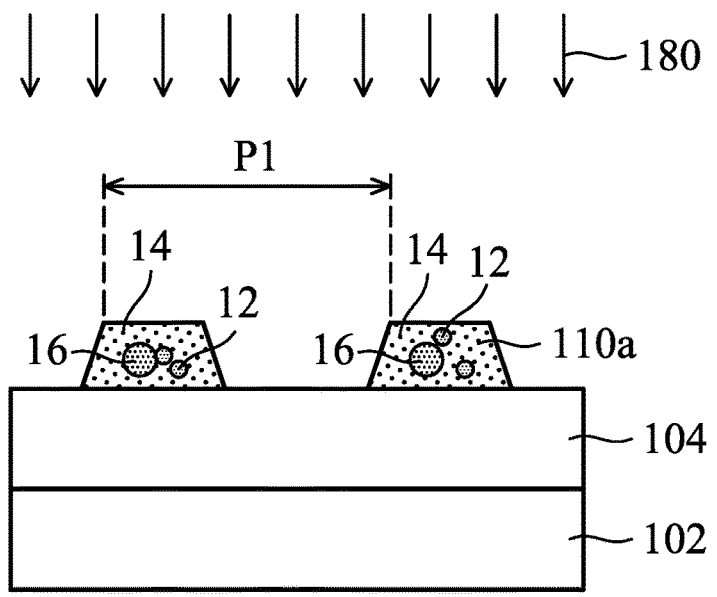
FIGS. 2A-2C show cross-sectional representations of various stages of forming a semiconductor structure, in accordance with some embodiments of the disclosure.
Figure 2B:
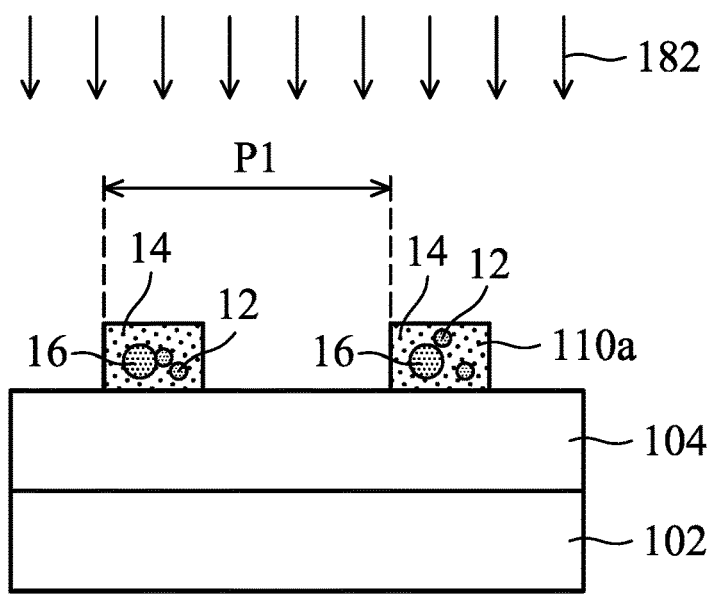
Figure 2C:
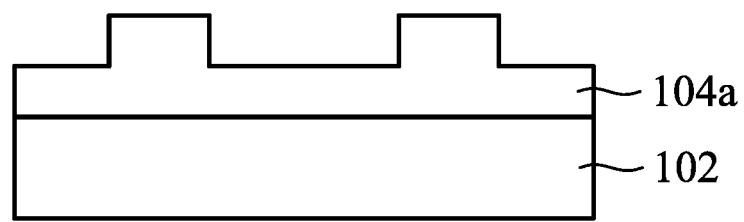

FIGS. 2A-2C show cross-sectional representations of various stages of forming a semiconductor structure, in accordance with some embodiments of the disclosure. The method can be used in many applications, such as FinFET device structure. Some processes and materials used to form the semiconductor device structure in FIGS. 2A-2C are similar to, or the same as, those used to form the semiconductor device structure FIGS. 1A-1D and are not repeated herein.

As shown in FIG. 2A, the development process 180 is performed to form a patterned resist layer 110a. However, some residues generated from un-reacted inorganic material 12 or the auxiliary 14 are not removed by the development process 180. Therefore, the patterned resist layer 110a has a footing bottom portion. The footing bottom portion may affect the following patterning process.

In order to remove the unwanted residues, as shown in FIG. 2B, an optional cleaning process 182 is performed on the patterned resist layer 110a. The cleaning process 182 is configured to remove the residues which are not completely removed by the development process 180. In some embodiments, the operation time of the development process 180 is in a range from about 15 seconds to about 150 seconds. In some embodiments, the operation time of the cleaning process 182 is in a range from about 15 seconds to about 150 seconds.

The cleaning process 182 includes using a rinse solvent. In some embodiments, the rinse solvent includes the developer, such as the ketone-based solvent shown in Tables 1-9 or the ester-based solvent shown in Tables 10-15, and the additive. In some other embodiments, the rinse solvent is mainly made of the developer used in the development process 180, the differences between the rinse solvent and the developer is the additive. In some embodiments, the rinse solvent is different from the developer used in the development process 180, and the rinse solvent includes amide, alcohol, ether or diol solvent.

The additive used in the rinse solvent in the cleaning process 182 includes acid with pka in a range from −4 to 8. The concentration of the additive in the rinse solvent in the cleaning process 182 is in a range from about 100 ppm to about 50000 ppm.

In some embodiments, the additive used in the cleaning process 182 includes formic acid, acetic acid, propanoic acid, chloroacetic acid, dichloroacetic acid, trichloroacetic acid, butyric acid, pentanoic acid, ethanedioic acid, maleic acid, acrylic acid, hydrochloric acid, nitric acid, boric acid, sulfuric acid, carbonic acid, phosphoric acid, hydrofluoric acid, hypochlorous acid, trifluoroacetic acid, hydrogen peroxide ($H_2O_2$), tetra-n-butylammonium fluoride (TBAF), or a combination thereof.

In some embodiments, the additive used in the cleaning process 182 is tetra-n-butylammonium fluoride (TBAF). In some embodiments, the additive used in the cleaning process 182 is acetic acid. In some other embodiments, the additive used in the cleaning process 182 is ethanedioic acid.

FIGS. 4A-4D show cross-sectional representations of various stages of forming a semiconductor structure, in accordance with some embodiments of the disclosure. The method can be used in many applications, such as FinFET device structure. Some processes and materials used to form the semiconductor device structure in FIGS. 4A-4D are similar to, or the same as, those used to form the semiconductor device structure FIGS. 1A-1D and are not repeated herein.

Figure 4A:
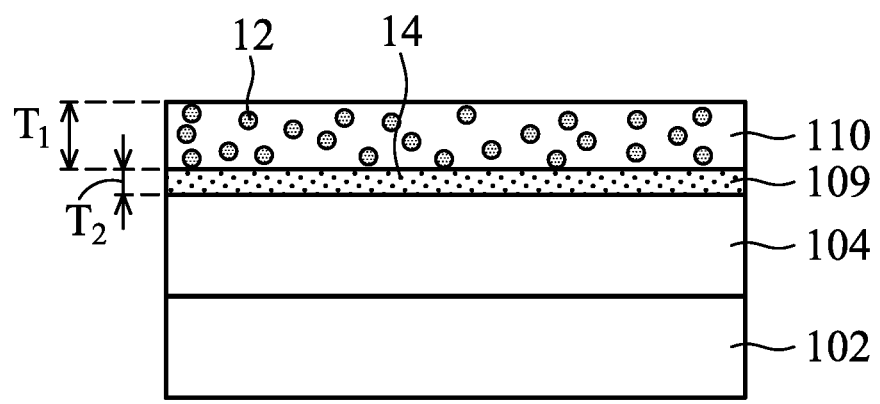
FIGS. 4A-4D show cross-sectional representations of various stages of forming a semiconductor structure, in accordance with some embodiments of the disclosure.

As shown in FIG. 4A, a modified layer 109 is formed over the material layer 104, and the resist layer 110 is formed over the modified layer 109. The modified layer 109 includes the auxiliary 14. The auxiliary 14 may include the photoacid generator (PAG), the quencher (Q), the cross-linker or the photo base generator (PBG). The materials of the auxiliary 14 have been described above, and are omitted here for brevity. The resist layer 110 includes the inorganic material 12 and the solvent. The inorganic material 12 is distributed uniformly in the solvent. The inorganic material 12 includes a number of metallic cores 122 and a number of first linkers $L_1$ 124 bonded to the metallic cores 122.

The resist layer 110 has a first thickness $T_1$, and the modified layer 109 has a second thickness $T_2$. In some embodiments, the first thickness $T_1$ is greater than the second thickness $T_2$. In some embodiments, a ratio of the first thickness $T_1$ to the second thickness $T_2$ is in a range from about 5% to about 20%.

Figure 4B:
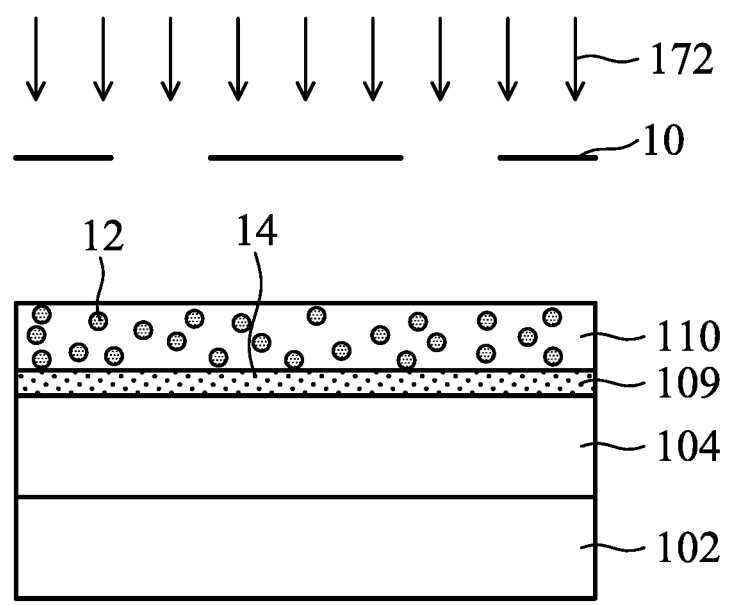

Afterwards, as shown in FIG. 4B, the mask 10 is formed over the resist layer 110, and the exposure process 172 is performed on the resist layer 110 to form an exposed region and an unexposed region, in accordance with some embodiments of the disclosure.

After the exposure process 172, the second linkers $L_2$ and the third linkers $L_3$ of the auxiliary 14 react with the first linkers $L_1$ 124 on the metallic cores 122 to form a number of chemical bonds between the inorganic material 12 and the auxiliary 14. With the help of the auxiliary 14, the chemical reaction between adjacent metallic cores 122 is accelerated. The compound 16 with a greater size than one of the metallic cores 122 is formed in the resist layer 110. More specifically, the compound 16 has an average molecular weight that is greater than that of the metallic core 122 with the first linkers $L_1$ 124.

Figure 4C:
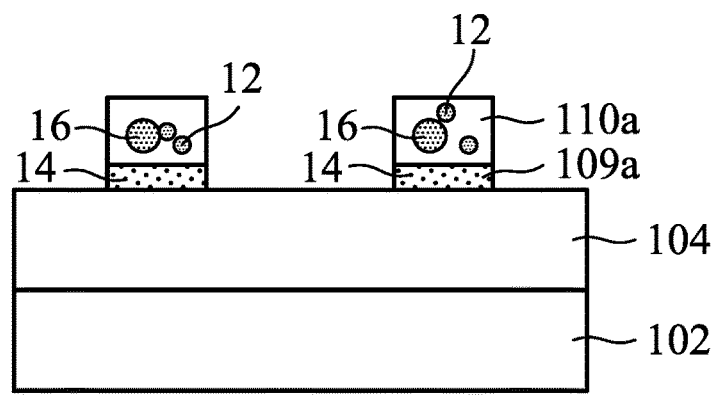

Next, as shown in FIG. 4C, the resist layer 110 and the modified layer 109 are developed by performing a development process 180 to form a patterned resist layer 110a and a patterned modified layer 109a, in accordance with some embodiments of the disclosure. In some embodiments, the resist layer 110 and the modified layer 109 are simultaneously developed. In some other embodiments, the resist layer 110 is patterned first, and the modified layer 109 is patterned later. In some embodiments, the compound 16 is closer to the interface between the modified layer 109 and the resist layer 110 than the inorganic material 12.

In some embodiments, the negative tone developer (NTD) process is performed, the exposed region of the resist layer 110 remains, and the unexposed region of the resist layer 110 is removed by the developer. The exposed region of the resist layer 110 will become more hydrophilic after performing the exposure process 172, and therefore organic solvent is used to remove the unexposed region of the resist layer 110.

In some embodiments, the NTD developer includes a ketone-based solvent, an ester-based solvent or a combination thereof. The ketone-based solvent having a total number of carbon atoms in a range from 5 to 15. In some embodiments, the ketone-based solvent has a formula (a):

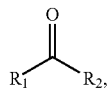

(a)

wherein $R_1$ is linear or branched $C_1$-$C_5$ alkyl, and $R_2$ is linear or branched $C_3$-$C_9$ alkyl. The detailed embodiments of the ketone-based solvent are described in Tables 1-9. In some embodiments, the developer includes 3-heptanone, 4-heptanone, 2-octanone, 5-methyl-2-hexanone, 2-4-dimethyl-3-pentanone, or a combination thereof.

In some embodiments, the NTD developer includes the ester-based solvent having a total number of carbon atoms in a range from about 5 to about 14. In some embodiments, the ester-based solvent has a formula (b):

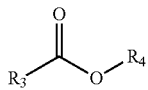

(b)

wherein $R_3$ is linear or branched $C_1$-$C_5$ alkyl, or linear or branched $C_2$ alkoxy, and $R_4$ is linear or branched $C_2$-$C_6$ alkyl, or linear or branched $C_3$-$C_6$ alkoxy. The detailed embodiments of the ester-based solvent are described in Tables 10-15. In some embodiments, the developer is the ester-based solvent, which is co-solvent, including 30 wt % to about 75 wt % of butyl acetate and 25 wt % to about 70 wt % of 1-methoxy-2-propanol acetate.

In some other embodiments, the optional cleaning process 182 is performed on the patterned resist layer 110a to remove unwanted residue. The cleaning process 182 includes using a rinse solvent. In some embodiments, the rinse solvent includes the developer, such as the ketone-based solvent or eater-based solvent, and the additive.

Figure 4D:
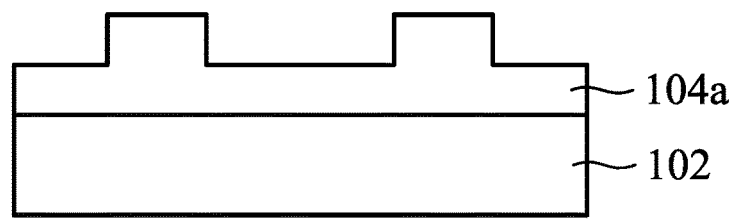

Subsequently, as shown in FIG. 4D, a portion of the material layer 104 is removed by performing an etching process and using the patterned resist layer 110a and the patterned modified layer 109a as a mask. As a result, a patterned material layer 104a is formed. Afterwards, the patterned resist layer 110a is removed.

FIGS. 5A-5E show cross-sectional representations of various stages of forming a semiconductor structure, in accordance with some embodiments of the disclosure. The method can be used in many applications, such as FinFET device structure. Some processes and materials used to form the semiconductor device structure in FIGS. 5A-5E are similar to, or the same as, those used to form the semiconductor device structure FIGS. 1A-1D and are not repeated herein.

Figure 5A:
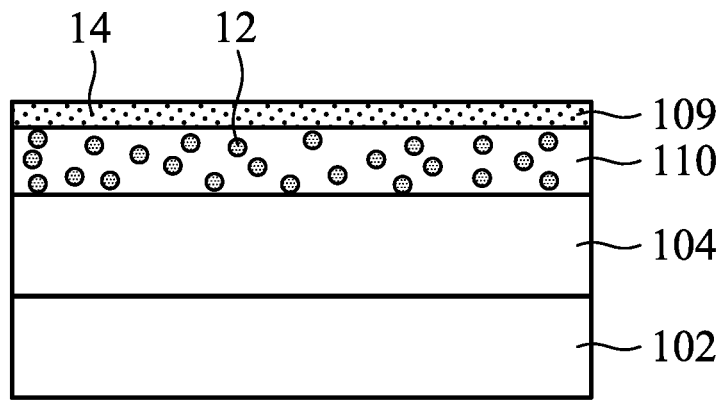
FIGS. 5A-5E show cross-sectional representations of various stages of forming a semiconductor structure, in accordance with some embodiments of the disclosure.

As shown in FIG. 5A, a modified layer 109 is formed over the resist layer 110. The modified layer 109 includes the auxiliary 14. The auxiliary 14 may include the photoacid generator (PAG), the quencher (Q), the cross-linker or the photo base generator (PBG). The materials of the auxiliary 14 have been described above, and are omitted here for brevity. The resist layer 110 includes the inorganic material 12 and the solvent. The inorganic material 12 is distributed uniformly in the solvent. The inorganic material 12 includes the metallic cores 122 and the first linkers $L_1$ 124 bonded to the metallic cores 122.

Figure 5B:
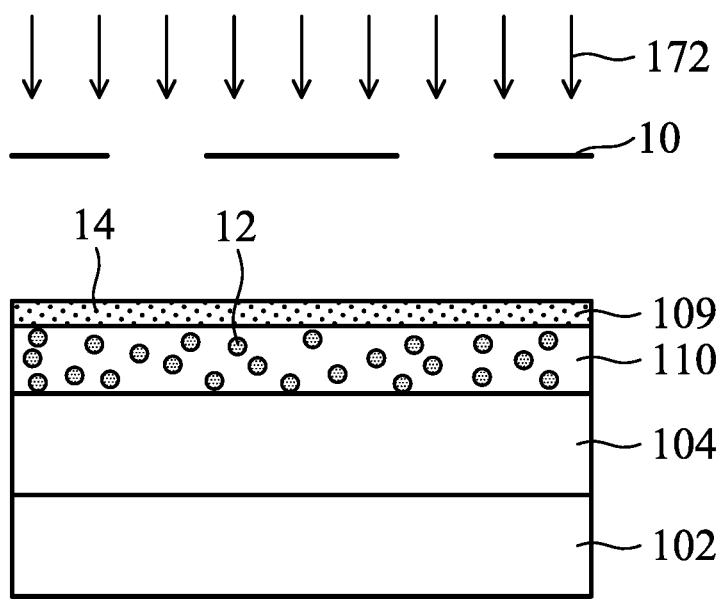

Afterwards, as shown in FIG. 5B, the mask 10 is formed over the modified layer 109, and the exposure process 172 is performed on the modified layer 109 and the resist layer 110, in accordance with some embodiments of the disclosure.

After the exposure process 172, the second linkers $L_2$ and the third linkers $L_3$ of the auxiliary 14 in the modified layer 109 react with the first linkers 124 on the metallic cores 122 in the resist layer 110 to form the chemical bonds between the inorganic material 12 and the auxiliary 14.

Figure 5C:
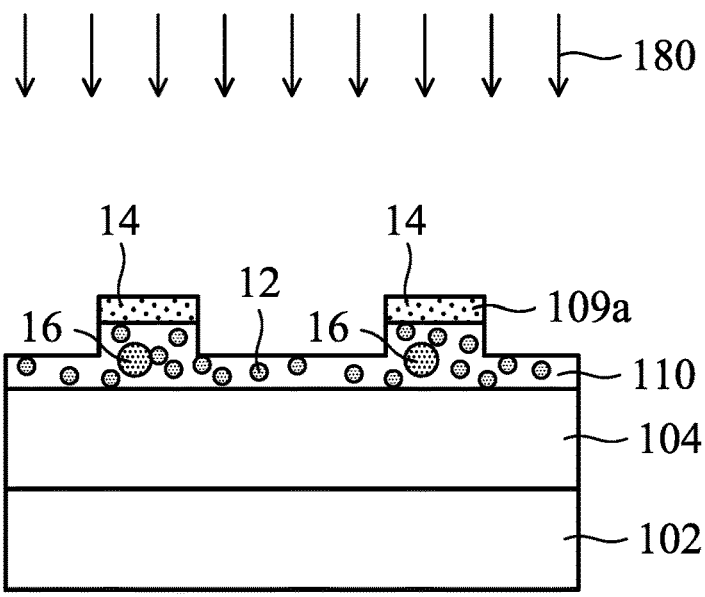

Afterwards, as shown in FIG. 5C, the modified layer 109 is developed by performing a first development process 180 to form a patterned modified layer 109a, in accordance with some embodiments of the disclosure. In addition, a portion of the resist layer 110 is also removed. In some embodiments, the negative tone developer (NTD) process is performed, the exposed region of the modified layer 109 remains, and the unexposed region of the modified layer 109 is removed by the ketone-based solvent, the ester-based solvent or a combination thereof. The detailed embodiments of the ketone-based solvent are described in Tables 1-9. In some embodiments, the developer includes 3-heptanone, 4-heptanone, 2-octanone, 5-methyl-2-hexanone, 2-4-dimethyl-3-pentanone, or a combination thereof. In some embodiments, the developer is the ester-based solvent, which is co-solvent, including 30 wt % to about 75 wt % of butyl acetate and 25 wt % to about 70 wt % of 1-methoxy-2-propanol acetate.

Figure 5D:
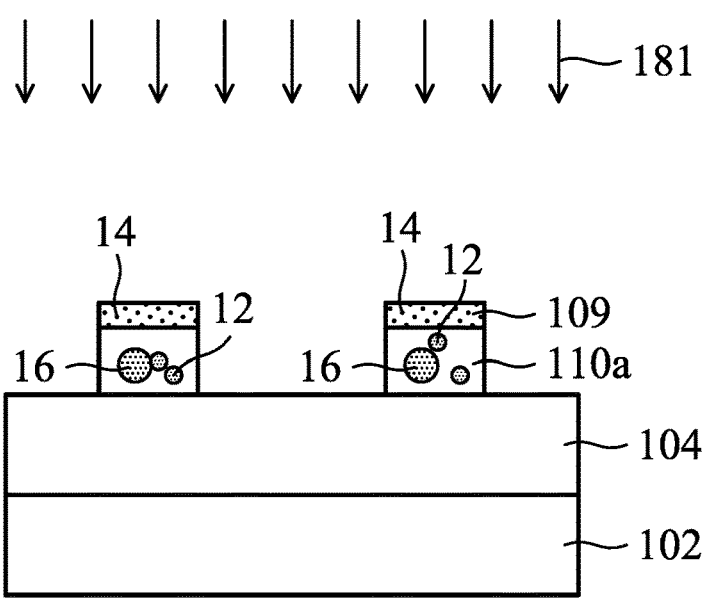

Subsequently, as shown in FIG. 5D, the resist layer 110 is developed by performing a second development process 181 to form a patterned resist layer 110a, in accordance with some embodiments of the disclosure. The compound 16 is closer to the interface between the modified layer 109 and the resist layer 110 than the metallic cores 122.

Figure 5E:
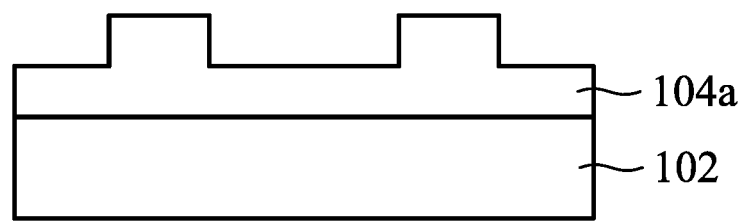

Next, as shown in FIG. 5E, a portion of the material layer 104 is removed by performing an etching process and using the patterned resist layer 110a and the patterned modified layer 109a as a mask. As a result, a patterned material layer 104a is formed. Afterwards, the patterned resist layer 110a and the patterned modified layer 109 are removed.

FIGS. 6A-6G show cross-sectional representations of various stages of forming a semiconductor structure, in accordance with some embodiments of the disclosure. The method can be used in many applications, such as FinFET device structure. Some processes and materials used to form the semiconductor device structure in FIGS. 6A-6G are similar to, or the same as, those used to form the semiconductor device structure FIGS. 1A-1D and are not repeated herein.

Figure 6A:
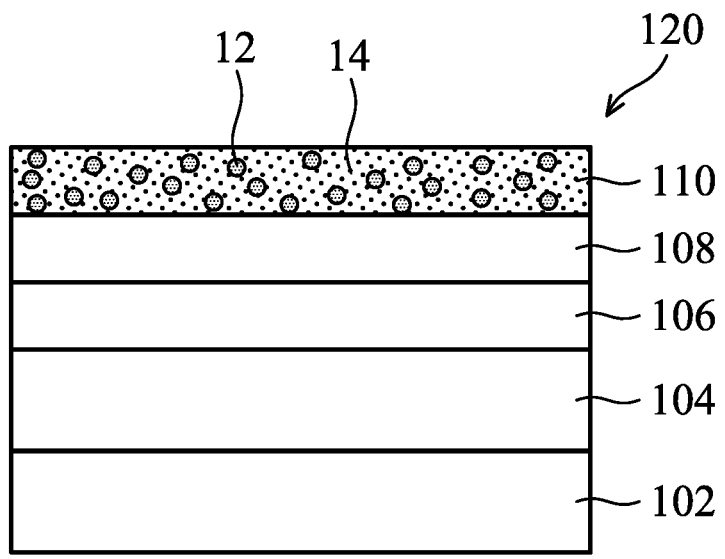
FIGS. 6A-6G show cross-sectional representations of various stages of forming a semiconductor structure, in accordance with some embodiments of the disclosure.

As shown in FIG. 6A, a tri-layer photoresist layer 120 is formed over the material layer 104 over the substrate 102. The tri-layer photoresist layer 120 includes a bottom layer 106, a middle layer 108 and a resist layer 110. The tri-layer photoresist layer 120 is used to pattern the underlying material layer 104 and then is removed.

The bottom layer 106 is formed over the material layer 104. The bottom layer 106 may be a first layer of a tri-layer resist layer 120 (also referred to as tri-layer photoresist). The bottom layer 106 may contain a material that is patternable and/or have an anti-reflection property. In some embodiments, the bottom layer 106 is a bottom anti-reflective coating (BARC) layer. In some embodiments, the bottom layer 106 includes a carbon backbone polymer. In some embodiments, the bottom layer 106 is made of silicon free material. In some other embodiments, the bottom layer 106 includes novolac resin, such as a chemical structure having multiple phenol units bonded together. In some embodiments, the bottom layer 106 is formed by a spin-on coating process, CVD process, PVD process, and/or other suitable deposition processes.

Afterwards, the middle layer 108 is formed over the bottom layer 106, and the resist layer 110 is formed over the middle layer 108. In some embodiments, the bottom layer 106, the middle layer 108 and the resist layer (or the top layer) 110 are called tri-layer photoresist layer 120. The middle layer 108 may have a composition that provides an anti-reflective property and/or hard mask property for the photolithography process. In addition, the middle layer 108 is designed to provide etching selectivity from the bottom layer 106 and the resist layer 110. In some embodiments, the middle layer 108 is made of silicon nitride, silicon oxynitride or silicon oxide. In some embodiments, the middle layer 108 includes a silicon-containing inorganic polymer. In some embodiments, the resist layer 110 includes a chemical structure as shown in FIG. 3A.

Figure 6B:
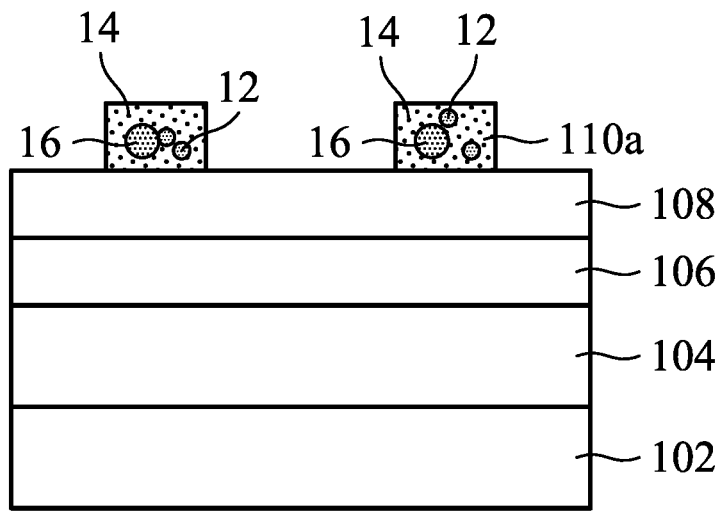

Next, as shown in FIG. 6B, an exposure process (not shown) is performed on the resist layer 110 to form an exposed region and an unexposed region, in accordance with some embodiments of the disclosure. Afterwards, the resist layer 110 is developed by the developer to form the patterned resist layer 110a. In some embodiments, the developer is a ketone-based solvent. The detailed embodiments of the ketone-based solvent are described in Tables 1-9. In some embodiments, the developer includes 3-heptanone, 4-heptanone, 2-octanone, 5-methyl-2-hexanone, 2-4-dimethyl-3-pentanone, or a combination thereof. In some embodiments, the developer is the ester-based solvent. The detailed embodiments of the ester-based solvent are described in Tables 10-15. In some embodiments, the developer is the ester-based solvent, which is co-solvent, including 30 wt % to about 75 wt % of butyl acetate and 25 wt % to about 70 wt % of 1-methoxy-2-propanol acetate. After the exposure process, the compound 16 is formed in the resist layer 110.

In some other embodiments, the optional cleaning process is performed on the patterned resist layer 110a to remove unwanted residue. The cleaning process includes using a rinse solvent. In some embodiments, the rinse solvent includes the developer, such as the ketone-based solvent or eater-based solvent, and the additive.

Figure 6C:
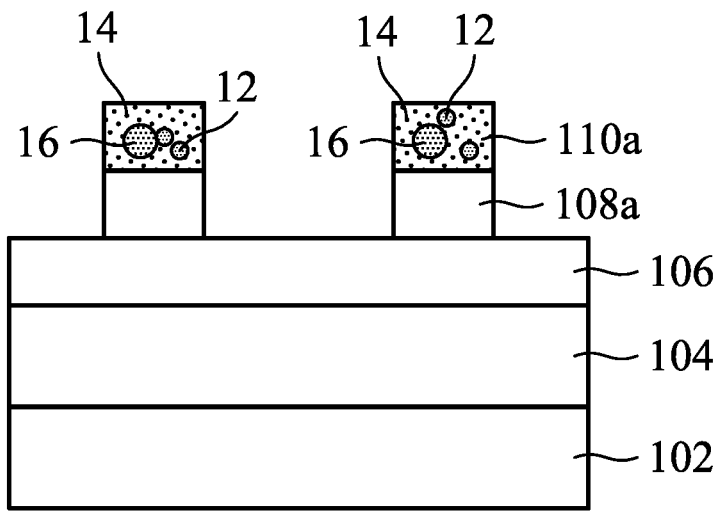

Afterwards, as shown in FIG. 6C, a portion of the middle layer 108 is removed by using the patterned resist layer 110a as a mask to form a patterned middle layer 108a, in accordance with some embodiments of the disclosure. As a result, the pattern of the patterned resist layer 110a is transferred to the middle layer 108.

The portion of the middle layer 108 is removed by a dry etching process, a wet etching process or a combination thereof. In some embodiments, the etching process includes a plasma etching process using an etchant having fluorine, such as $CF_2$, $CF_3$, $CF_4$, $C_2F_2$, $C_2F_3$, $C_3F_4$, $C_4F_4$, $C_4F_6$, $C_5F_6$, $C_6F_6$, $C_6F_8$, or a combination thereof.

Figure 6D:
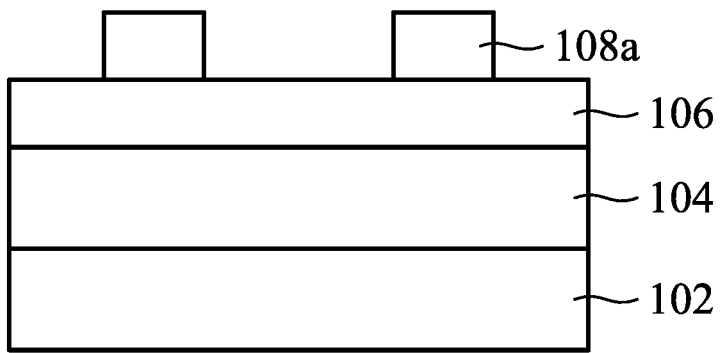

Afterwards, as shown in FIG. 6D, the patterned resist layer 110a is removed, in accordance with some embodiments of the disclosure. In some embodiments, the patterned resist layer 110a is removed by a wet etching process or a dry etching process. In some embodiments, the patterned resist layer 110a is removed by the wet etching process including a base solution, and the base solution is tetraalkylammonium hydroxide (TMAH).

Figure 6E:
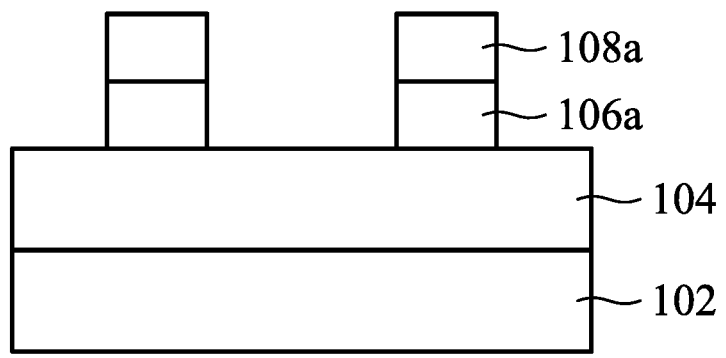

Next, as shown in FIG. 6E, a portion of the bottom layer 106 is removed by using the patterned middle layer 108a as a mask to form a patterned bottom layer 106a, in accordance with some embodiments of the disclosure. As a result, the pattern of the patterned middle layer 108a is transferred to the bottom layer 106.

Figure 6F:
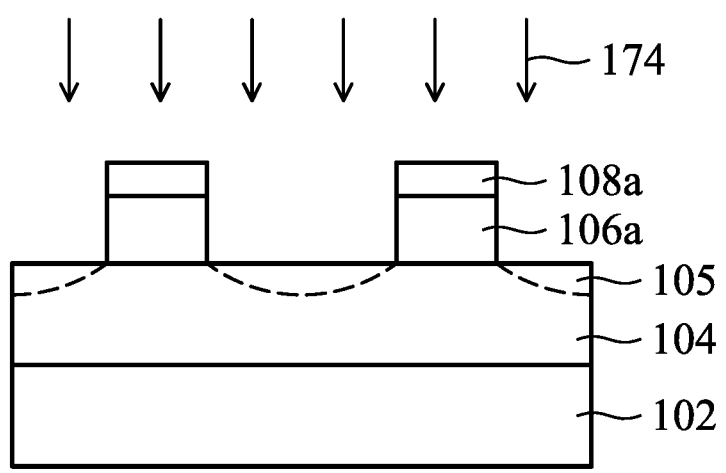
Figure 6G:
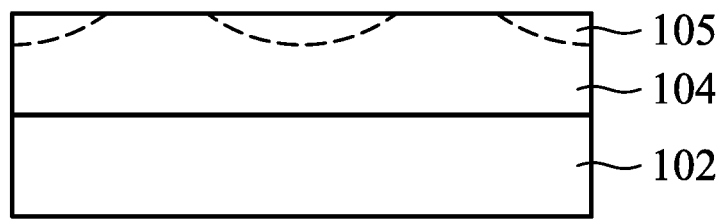

Afterwards, as shown in FIG. 6F, a portion of the material layer 104 is doped by performing an ion implantation process 174 and using the patterned middle layer 108a and the patterned bottom layer 106a as a mask, in accordance with some embodiments of the disclosure. As a result, a doped region 105 is formed in the material layer 104. The doped region 105 may be doped with p-type dopants, such as boron or $BF_2$, and/or n-type dopants, such as phosphorus (P) or arsenic (As). Next, the patterned middle layer 108a and the patterned bottom layer 106a are removed.

FIGS. 7A-7F show cross-sectional representations of various stages of forming a semiconductor structure, in accordance with some embodiments of the disclosure. The method can be used in many applications, such as FinFET device structure. Some processes and materials used to form the semiconductor device structure in FIGS. 7A-7F are similar to, or the same as, those used to form the semiconductor device structure FIGS. 6A-6G and are not repeated herein.

Figure 7A:
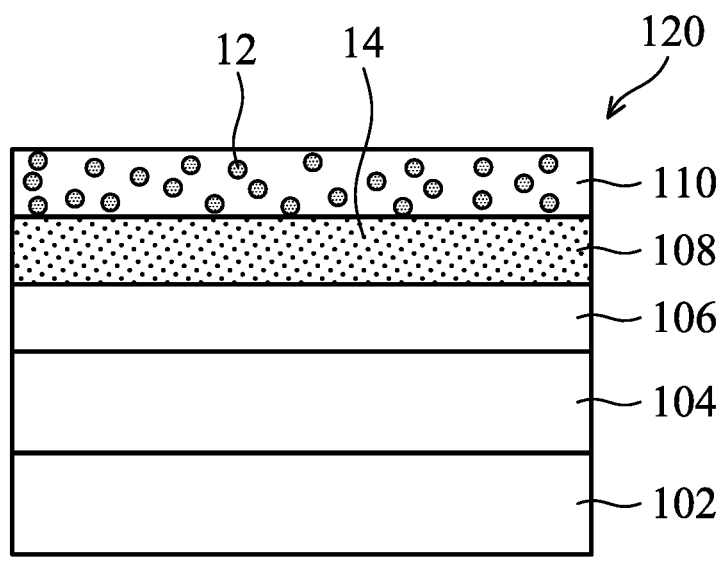
FIGS. 7A-7F show cross-sectional representations of various stages of forming a semiconductor structure, in accordance with some embodiments of the disclosure.

As shown in FIG. 7A, the tri-layer photoresist layer 120 is formed over the material layer 104. The middle layer 108 includes an auxiliary 14 distributed in the solvent of the middle layer 108. The auxiliary 14 may include the PAG, the quencher (Q), the cross-linker or the PBG. The resist layer 110 includes an inorganic material 12 and a solvent. The inorganic material 12 includes the first linker $L_1$ 124 bonded to the metallic cores 122.

Figure 7B:
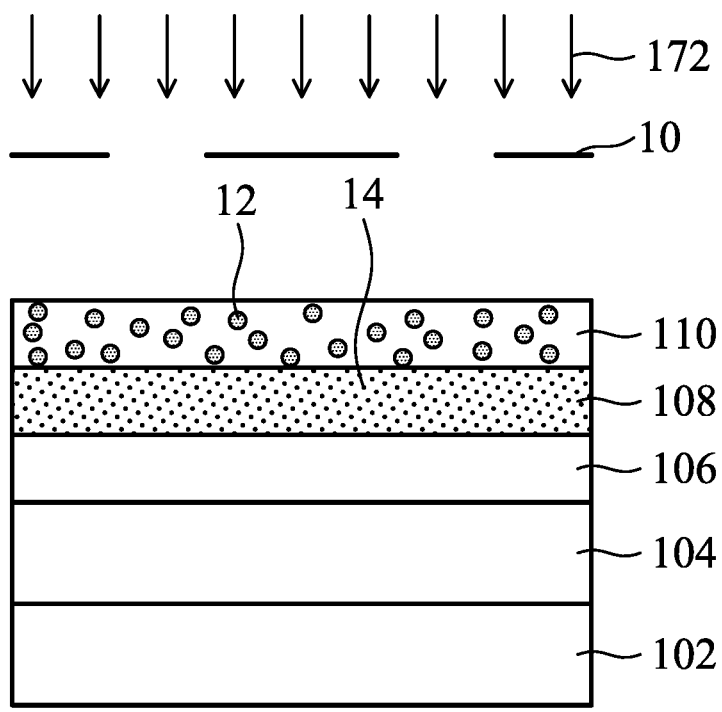

Next, as shown in FIG. 7B, the mask 10 is formed over the modified layer 109, and the exposure process 172 is performed on the modified layer 109 and the resist layer 110, in accordance with some embodiments of the disclosure.

After the exposure process 172, the second linkers $L_2$ and the third linkers $L_3$ of the auxiliary 14 in the modified layer 109 react with the first linkers 124 on the metallic cores 122 in the resist layer 110 to form the chemical bonds between the inorganic material 12 and the auxiliary 14. With the help of the auxiliary 14, the reaction rate of the chemical reaction between adjacent metallic cores 122 is increased.

Figure 7C:
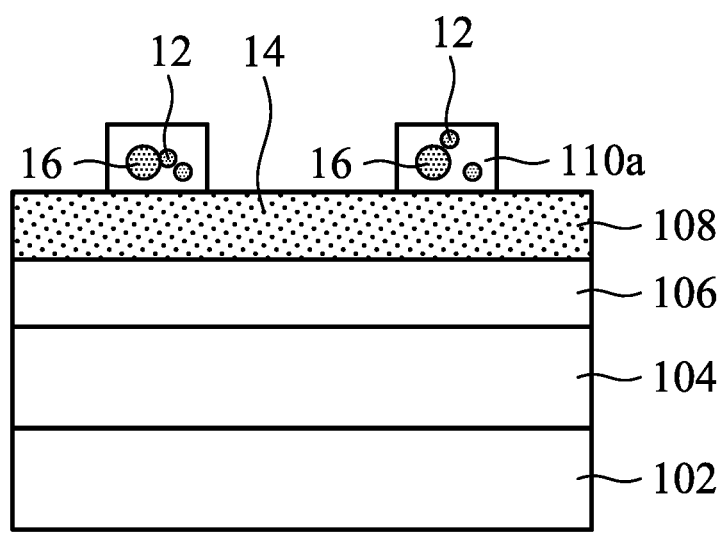

Afterwards, as shown in FIG. 7C, the resist layer 110 is developed by using a developer to form the patterned resist layer 110a, in accordance with some embodiments of the disclosure. The compound 16 is formed in the resist layer 110. The compound 16 is formed by reacting the inorganic material 12 and the auxiliary 14. In some embodiments, the developer is a ketone-based solvent, an ester-based solvent or a combination thereof. The detailed embodiments of the ketone-based solvent are described in Tables 1-9. In some embodiments, the developer includes 3-heptanone, 4-heptanone, 2-octanone, 5-methyl-2-hexanone, 2-4-dimethyl-3-pentanone, or a combination thereof. The detailed embodiments of the ester-based solvent are described in Tables 10-15. In some embodiments, the developer is the ester-based solvent, which is co-solvent, including 30 wt % to about 75 wt % of butyl acetate and 25 wt % to about 70 wt % of 1-methoxy-2-propanol acetate.

Figure 7D:
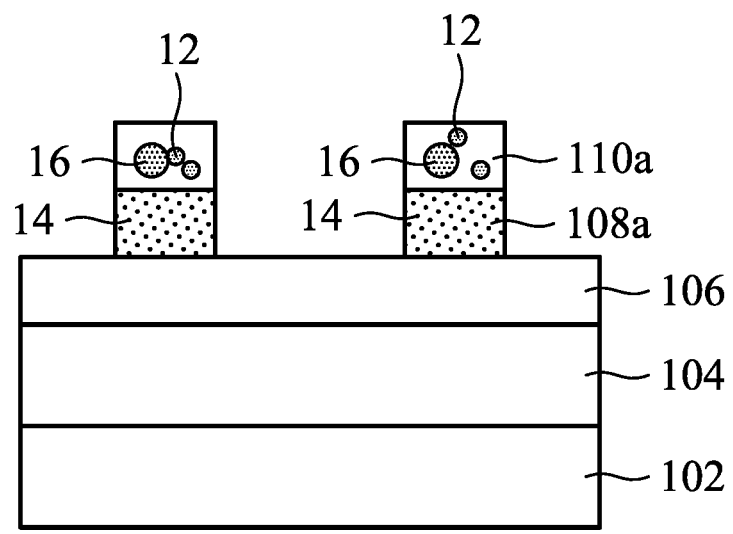
Figure 7E:
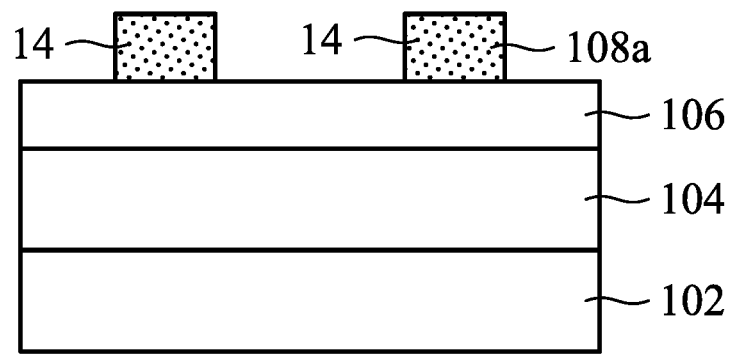
Figure 7F:
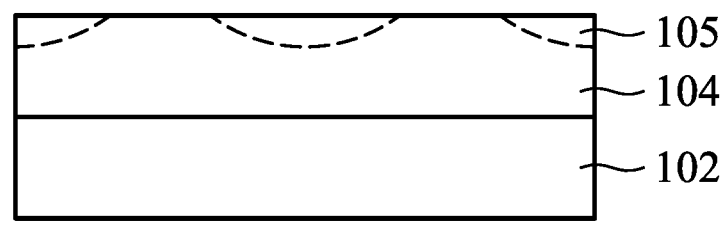

Afterwards, as shown in FIG. 7D, a portion of the middle layer 108 is removed by using the patterned resist layer 110a as a mask to form a patterned middle layer 108a, in accordance with some embodiments of the disclosure. As a result, the pattern of the patterned resist layer 110a is transferred to the middle layer 108. Afterwards, the substrate 102 continues to perform the fabricating processes similar to the fabricating processes as shown in FIGS. 6D-6G. As a result, as shown in FIG. 7F, the doped region 105 is formed in the material layer 104.

FIGS. 8A-8D show cross-sectional representations of various stages of forming a semiconductor structure, in accordance with some embodiments of the disclosure. The method can be used in many applications, such as FinFET device structure. Some processes and materials used to form the semiconductor device structure in FIGS. 8A-8D are similar to, or the same as, those used to form the semiconductor device structure FIGS. 6A-6G and are not repeated herein.

Figure 8A:
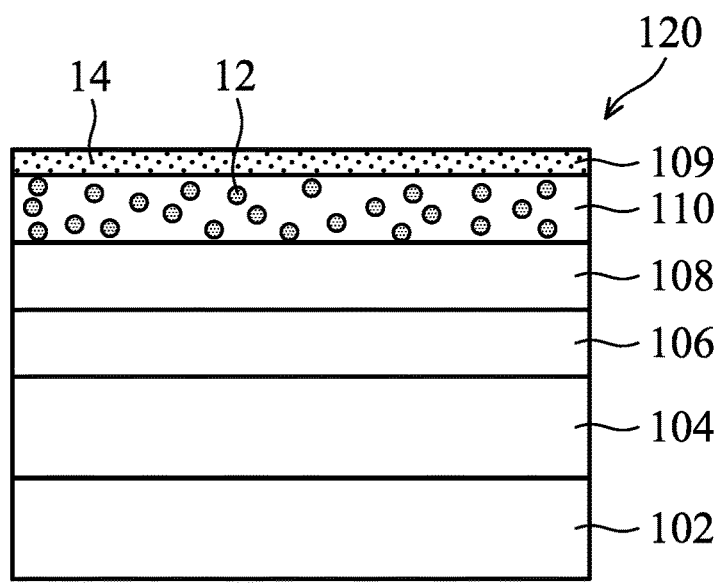
FIGS. 8A-8D show cross-sectional representations of various stages of forming a semiconductor structure, in accordance with some embodiments of the disclosure.

As shown in FIG. 8A, the modified layer 109 is formed over the tri-layer photoresist layer 120, in accordance with some embodiments of the disclosure.

Figure 8B:
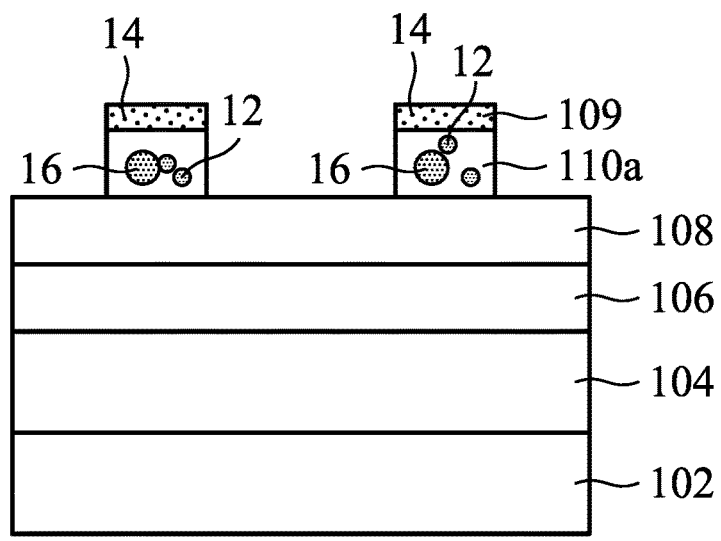

Next, as shown in FIG. 8B, an exposure process (not shown) is performed on the modified layer 109 and the resist layer 110, in accordance with some embodiments of the disclosure. Afterwards, the modified layer 109 and the resist layer 110 are sequentially developed by two developers to form the patterned modified layer 109a and the patterned resist layer 110a.

Figure 8C:
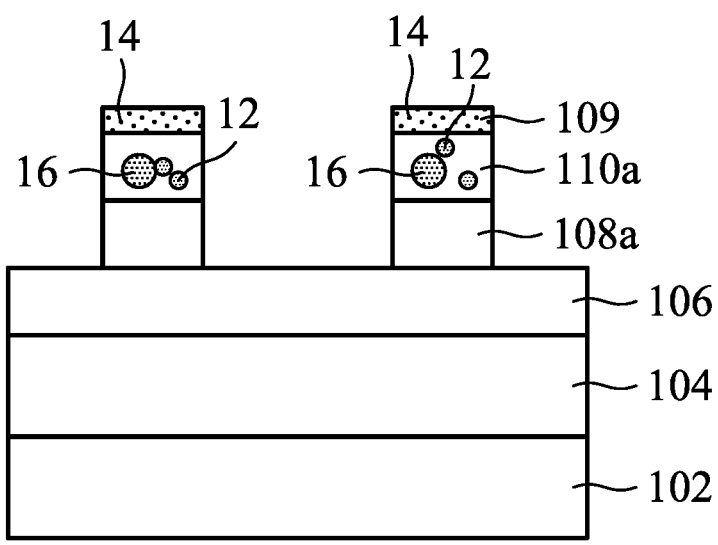
Figure 8D:
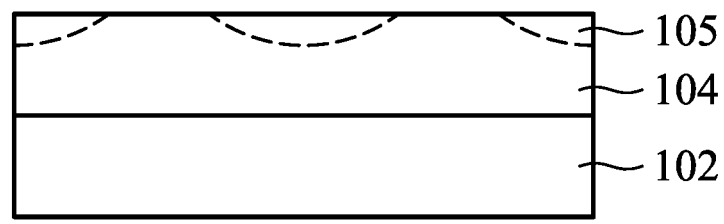

Afterwards, as shown in FIG. 8C, a portion of the middle layer 108 is removed by using the patterned resist layer 110a and the patterned modified layer 109a as a mask to form a patterned middle layer 108a, in accordance with some embodiments of the disclosure. As a result, the pattern of the patterned resist layer 110a is transferred to the middle layer 108. Afterwards, the substrate 102 continues to perform the fabricating processes similar to the fabricating processes as shown in FIGS. 5D-5G. As a result, as shown in FIG. 8D, the doped region 105 is formed in the material layer 104.

Embodiments for forming a semiconductor device structure are provided. A material layer is formed over a substrate, and a resist layer is formed over the material layer. The resist layer includes an inorganic material and an auxiliary, the inorganic material includes a number of metallic cores and a number of first linkers bonded to the metallic cores. The auxiliary includes the second linkers $L_2$ and the third linkers $L_3$. After performing the exposure process on the resist layer, the second linkers $L_2$ and the third linkers $L_3$ of the auxiliary react with the first linkers $L_1$ of the inorganic materials to form a compound which has a size greater than the size of each of the metallic core. The auxiliary can accelerate the cross-linking reactions between the first linkers $L_1$, the second linkers $L_2$ and the third linkers $L_3$. In addition, the ketone-based solvent, the ester-based solvent or a combination thereof is used to remove the unexposed region of the resist layer. Therefore, the radiation energy of the exposure process is reduced due to the addition of the auxiliary in the resist layer and using the hydrophobic ketone-based solvent. Furthermore, the line width roughness (LWR) of the resist layer is improved. Therefore, the line critical dimension uniformity (LCDU) of the semiconductor structure is improved.

In some embodiments, a method for forming a semiconductor structure is provided. The method includes forming a material layer over a substrate and forming a resist layer over the material layer. The resist layer includes an inorganic material and an auxiliary, the inorganic material includes a plurality of metallic cores, and a plurality of first linkers bonded to the metallic cores. The method includes exposing a portion of the resist layer, and the resist layer includes an exposed region and an unexposed region, and in the exposed region, the auxiliary reacts with the first linkers. The method also includes removing the unexposed region of the resist layer by using a developer to form a patterned resist layer. The developer includes a ketone-based solvent having a substituted or unsubstituted $C_6$-$C_7$ cyclic ketone, an ester-based solvent having a formula (b), or a combination thereof:

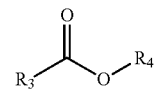

wherein $R_3$ is linear or branched $C_1$-$C_5$ alkyl, or linear or branched $C_2$ alkoxy, and $R_4$ is linear or branched $C_2$-$C_6$ alkyl, or linear or branched $C_3$-$C_6$ alkoxy.

In some embodiments, a method for forming a semiconductor structure is provided. The method includes forming a material layer over a substrate and forming a bottom layer over the material layer. The method also includes forming a middle layer over the bottom layer and forming a resist layer over the middle layer. The resist layer includes an inorganic material having a plurality of metallic cores and a plurality of first linkers bonded to the metallic cores. The method further includes forming a modified layer below or above the resist layer, and the modified layer includes an auxiliary. The method further includes exposing a portion of the resist layer by performing an exposure process, and the auxiliary reacts with the first linkers during the exposure process. The method includes developing the resist layer to form a patterned resist layer by using a ketone-based solvent having a substituted or unsubstituted $C_6$-$C_7$ cyclic ketone, or an ester-based solvent having a formula (b):

(b)

wherein $R_3$ is linear or branched $C_1$-$C_5$ alkyl, or linear or branched $C_2$ alkoxy, and $R_4$ is linear or branched $C_2$-$C_6$ alkyl, or linear or branched $C_3$-$C_6$ alkoxy In some embodiments, a method for forming a semiconductor structure is provided. The method includes forming a material layer over a substrate and forming a bottom layer over the material layer. The method includes forming a middle layer over the bottom layer and forming a resist layer over the middle layer. The resist layer includes an inorganic material and an auxiliary, the inorganic material includes a plurality of first linkers bonded to a plurality of metallic cores, and the auxiliary includes a plurality of second linkers. The method also includes exposing a portion of the resist layer by performing an exposure process, and the second linkers react with the first linkers during the exposure process. The method includes removing a portion of the resist layer to form a patterned resist layer by using an ester-based solvent having a formula (b):

(b)

wherein $R_3$ is linear or branched $C_1$-$C_5$ alkyl, or linear or branched $C_2$ alkoxy, and $R_4$ is linear or branched $C_2$-$C_6$ alkyl, or linear or branched $C_3$-$C_6$ alkoxy.

The method includes removing a portion of the middle layer by using the patterned resist layer as a mask to form a patterned middle layer and removing a portion of the bottom layer by using the patterned middle layer as a mask to form a patterned bottom layer.

In some embodiments, a method for forming a semiconductor structure is provided. The method includes forming a material layer over a substrate, and forming a resist layer over the material layer, wherein the resist layer comprises an inorganic material. The inorganic material includes a plurality of metallic cores and a plurality of first linkers bonded to the metallic cores. The method includes forming a modified layer over the resist layer, and the modified layer includes an auxiliary. The method includes performing an exposure process on the modified layer and the resist layer, and removing a portion of the modified layer and a first portion of the resist layer by a first developer. The first developer includes a ketone-based solvent having a substituted or unsubstituted $C_6$-$C_7$ cyclic ketone, an ester-based solvent having a formula (b), or a combination thereof. $R_3$ is linear or branched $C_1$-$C_5$ alkyl, or linear or branched $C_2$ alkoxy, and $R_4$ is linear or branched $C_2$-$C_6$ alkyl, or linear or branched $C_3$-$C_6$ alkoxy. The method also includes removing a second portion of the resist layer to expose a top surface of the material layer.

In some embodiments, a method for forming a semiconductor structure is provided. The method includes for forming a material layer over a substrate, and forming a bottom layer over the material layer. The method also includes forming a middle layer over the bottom layer, and the middle layer includes an auxiliary, and the auxiliary comprises a plurality of second linkers. The method further includes forming a resist layer over the middle layer, and the resist layer includes an inorganic material, the inorganic material comprises a plurality of first linkers bonded to a plurality of metallic cores. The method includes exposing a portion of the resist layer by performing an exposure process, and the second linkers of the auxiliary bond to the metallic cores through the first linkers during the exposure process. The method includes removing a portion of the resist layer to form a patterned resist layer by using an ester-based solvent having a formula (b). $R_3$ is linear or branched $C_1$-$C_5$ alkyl, or linear or branched $C_2$ alkoxy, and $R_4$ is linear or branched $C_2$-$C_6$ alkyl, or linear or branched $C_3$-$C_6$ alkoxy.

In some embodiments, a method for forming a semiconductor structure is provided. The method includes forming a material layer over a substrate, and forming a bottom layer over the material layer. The method also includes forming a middle layer over the bottom layer, and forming a resist layer over the middle layer. The resist layer includes an inorganic material, and the inorganic material includes a plurality of metallic cores and a plurality of first linkers bonded to the metallic cores. The method also includes forming a modified layer over the resist layer, and the modified layer includes an auxiliary. The method includes exposing a portion of the resist layer by performing an exposure process, and developing the resist layer to form a patterned resist layer by using cycloheptanone, butyl butyrate, isopropyl butyrate, propyl isobutyrate, butyl 2-methylbutyrate, ethyl trimethylacetate, ethyl valerate, ethyl isovalerate, ethyl 2-methylbutyrate, or methyl 4-methylvalerate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a material layer over a substrate;
    forming a resist layer over the material layer, wherein the resist layer comprises an inorganic material, the inorganic material comprises a plurality of metallic cores and a plurality of first linkers bonded to the metallic cores;
    forming a modified layer over the resist layer, wherein the modified layer comprises an auxiliary;
    performing an exposure process on the modified layer and the resist layer;
    removing a portion of the modified layer and a first portion of the resist layer by a first developer, wherein the first developer comprises a ketone-based solvent having a substituted or unsubstituted C6-C7 cyclic ketone, an ester-based solvent having a formula (b), or a combination thereof:

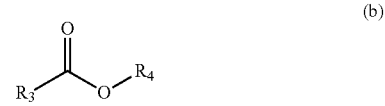

(b)

wherein R3 is linear or branched C1-C5 alkyl, or linear or branched C2 alkoxy, and R4 is linear or branched C2-C6 alkyl, or linear or branched C3-C6 alkoxy; and
    removing a second portion of the resist layer to expose a top surface of the material layer and to form a patterned resist layer, wherein the top surface of the material layer is in direct contact with a bottom surface of the patterned resist layer.

2. The method for forming the semiconductor structure as claimed in claim 1, wherein the auxiliary comprises a plurality of second linkers, and the second linkers react with the first linkers during the exposure process to form a plurality of chemical bonds between the auxiliary and the inorganic material.

3. The method for forming the semiconductor structure as claimed in claim 1, wherein the top surface of the material layer is covered by the second portion of the resist layer before removing the second portion of the resist layer.

4. The method for forming the semiconductor structure as claimed in claim 1, wherein the metallic cores comprise tin (Sn), indium (In), antimony (Sb).

5. The method for forming the semiconductor structure as claimed in claim 1, wherein the first developer includes 3-heptanone, 4-heptanone, 2-octanone, 5-methyl-2-hexanone, 2-4-dimethyl-3-pentanone, or a combination thereof.

6. The method for forming the semiconductor structure as claimed in claim 1, wherein the first developer includes butyl acetate and 1-methoxy-2-propanol acetate.

7. The method for forming the semiconductor structure as claimed in claim 1, further comprising:
forming a compound in the resist layer during the exposure process, wherein the compound is closer to an interface between the modified layer and the resist layer than the metallic cores.

8. The method for forming the semiconductor structure as claimed in claim 7, wherein the compound is not removed by the first developer.

9. A method for forming a semiconductor structure, comprising:
forming a material layer over a substrate;
forming a bottom layer over the material layer;
forming a middle layer over the bottom layer, wherein the middle layer comprises an auxiliary, and the auxiliary comprises a plurality of second linkers;
forming a resist layer over the middle layer, wherein the resist layer comprises an inorganic material, the inorganic material comprises a plurality of first linkers bonded to a plurality of metallic cores;
exposing a portion of the resist layer by performing an exposure process, wherein the second linkers of the auxiliary bond to the metallic cores through the first linkers during the exposure process; and
removing a portion of the resist layer to form a patterned resist layer by using an ester-based solvent having a formula (b):

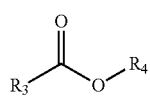
(b)

wherein R3 is linear or branched C1-C5 alkyl, or linear or branched C2 alkoxy, and R4 is linear or branched C2-C6 alkyl, or linear or branched C3-C6 alkoxy, wherein a sidewall surface of the middle layer extends beyond a sidewall surface of the patterned resist layer.

10. The method for forming the semiconductor structure as claimed in claim 9, wherein the second linkers react with the first linkers during the exposure process to form a plurality of chemical bonds between the auxiliary and the inorganic material.

11. The method for forming the semiconductor structure as claimed in claim 9, wherein the metallic cores comprise tin (Sn), indium (In), antimony (Sb).

12. The method for forming the semiconductor structure as claimed in claim 9, further comprising:
removing a portion of the middle layer by using the patterned resist layer as a mask to form a patterned middle layer; and
removing a portion of the bottom layer by using the patterned middle layer as a mask to form a patterned bottom layer.

13. The method for forming the semiconductor structure as claimed in claim 9, further comprising:
after using the ester-based solvent, performing a rinse process on the resist layer, wherein the rinse process comprises a rinse solvent, and the rinse solvent includes the ester-based solvent and an additive.

14. The method for forming the semiconductor structure as claimed in claim 13, wherein the additive comprises formic acid, acetic acid, propanoic acid, chloroacetic acid, dichloroacetic acid, trichloroacetic acid, butyric acid, pentanoic acid, ethanedioic acid, maleic acid, acrylic acid, hydrochloric acid, nitric acid, boric acid, sulfuric acid, carbonic acid, phosphoric acid, hydrofluoric acid, hypochlorous acid, trifluoroacetic acid or a combination thereof.

15. The method for forming the semiconductor structure as claimed in claim 9, wherein a topmost surface of the middle layer is in direct contact with a bottommost surface of the resist layer.

16. A method for forming a semiconductor structure, comprising:
forming a material layer over a substrate;
forming a bottom layer over the material layer;
forming a middle layer over the bottom layer;
forming a resist layer over the middle layer, wherein the resist layer comprises an inorganic material, and the inorganic material comprises a plurality of metallic cores and a plurality of first linkers bonded to the metallic cores;
forming a modified layer over the resist layer, wherein the modified layer comprises an auxiliary;
exposing a portion of the resist layer by performing an exposure process; and
developing the resist layer to form a patterned resist layer to expose a topmost surface of the middle layer which is directly below the patterned resist layer, wherein developing the resist layer is by using cycloheptanone, butyl butyrate, isopropyl butyrate, propyl isobutyrate, butyl 2-methylbutyrate, ethyl trimethylacetate, ethyl valerate, ethyl isovalerate, ethyl 2-methylbutyrate, or methyl 4-methylvalerate.

17. The method for forming the semiconductor structure as claimed in claim 16, further comprising:
forming a compound in the resist layer during the exposure process, wherein the compound is made of the metallic cores, the second linkers and the first linkers.

18. The method for forming the semiconductor structure as claimed in claim 17, wherein the compound is not removed by cycloheptanone, butyl butyrate, isopropyl butyrate, propyl isobutyrate, butyl 2-methylbutyrate, ethyl trimethylacetate, ethyl valerate, ethyl isovalerate, ethyl 2-methylbutyrate, or methyl 4-methylvalerate.

19. The method for forming the semiconductor structure as claimed in claim 16, wherein the metallic cores comprise tin (Sn), indium (In), antimony (Sb).

20. The method for forming the semiconductor structure as claimed in claim 16, wherein a topmost surface of the middle layer is in direct contact with a bottommost surface of the resist layer.

* * * * *